United States Patent
Ito et al.

(10) Patent No.: US 11,366,385 B2
(45) Date of Patent: Jun. 21, 2022

(54) IMPRINT MOLD, MANUFACTURING METHOD THEREOF, AND IMPRINT METHOD

(71) Applicant: CANON KABUSHIKI KAISHA, Tokyo (JP)

(72) Inventors: Toshiki Ito, Kawasaki (JP); Masayuki Nakajima, Utsunomiya (JP); Kiyohito Yamamoto, Utsunomiya (JP); Yuichiro Oguchi, Tokyo (JP); Naoki Kiyohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/852,201

(22) Filed: Apr. 17, 2020

(65) Prior Publication Data

US 2020/0341370 A1   Oct. 29, 2020

(30) Foreign Application Priority Data

Apr. 24, 2019   (JP) .............................. JP2019-083329

(51) Int. Cl.
G03F 7/00      (2006.01)
B29C 33/42     (2006.01)

(52) U.S. Cl.
CPC .......... G03F 7/0002 (2013.01); B29C 33/424 (2013.01); B29C 2033/426 (2013.01)

(58) Field of Classification Search
CPC ........................ G03F 7/0002; B29C 2033/426
See application file for complete search history.

(56) References Cited

U.S. PATENT DOCUMENTS

2003/0026972 A1\* 2/2003 Reihs ...................... C03C 17/38
428/306.6
2008/0303187 A1\* 12/2008 Stacey ................... B82Y 10/00
264/293

(Continued)

FOREIGN PATENT DOCUMENTS

JP      2009-45925 A      3/2009
JP      2009045925 A   \*  3/2009
JP      6441181 B2        12/2018

OTHER PUBLICATIONS

Gisele-Azimi, et al., "Hydrophobicity of Rare-Earth-Oxide Ceramics" Nature Materials; 2013, pp. 1-20, Macmillan Publishers, Ltd., DOI:10.1038/NMAT3545, Cambridge, MA.

*Primary Examiner* — Kelly M Gambetta
*Assistant Examiner* — Virak Nguon
(74) *Attorney, Agent, or Firm* — Canon U.S.A., Inc., IP Division

(57) ABSTRACT

An imprint mold includes a mesa portion projecting from a base material. The mesa portion includes a contact surface configured for contact with a curable composition made of an organic material, and a surface of a side wall at which the contact surface projects from the base material. A liquid repellent surface is formed on at least the surface of the side wall, the liquid repellent surface having a contact angle with respect to the curable composition being higher than a contact angle of the contact surface. The liquid repellent surface includes at least one type of compound selected from the group consisting of an oxide of an inorganic element, a fluoride of an inorganic element, and a nitride of an inorganic element.

11 Claims, 15 Drawing Sheets

(56) References Cited

U.S. PATENT DOCUMENTS

| | | | | |
|---|---|---|---|---|
| 2015/0314488 A1* | 11/2015 | Hahm | ................... | G03F 7/0002 216/52 |
| 2018/0016673 A1* | 1/2018 | Nakamura | ............ | G03F 7/0002 |
| 2019/0287794 A1* | 9/2019 | Umezawa | ............. | G03F 7/0002 |

* cited by examiner

FIG.2
(2-1)
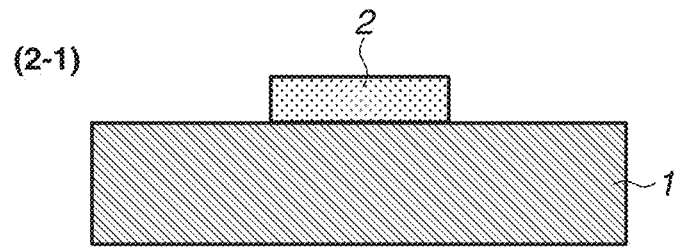
(2-2)
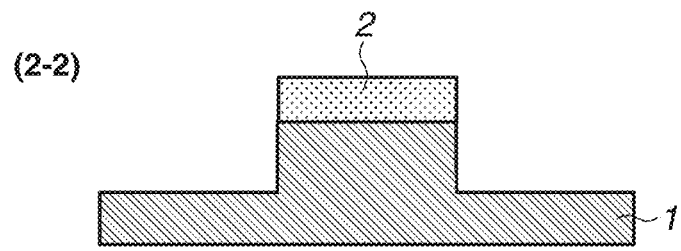
(2-3)
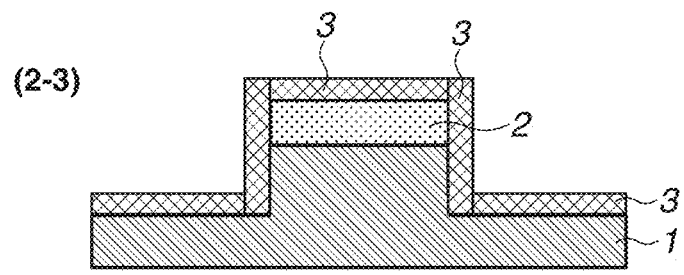
(2-4)
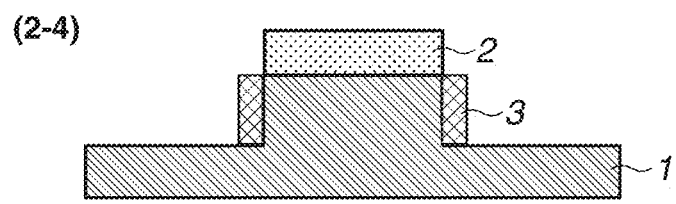
(2-5)
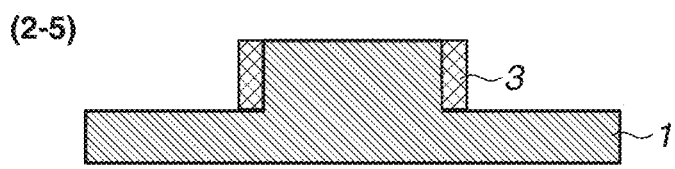

FIG.3
(3-1)
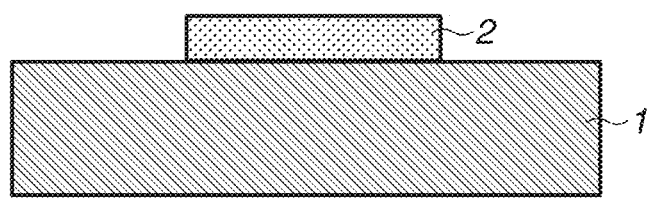
(3-2)
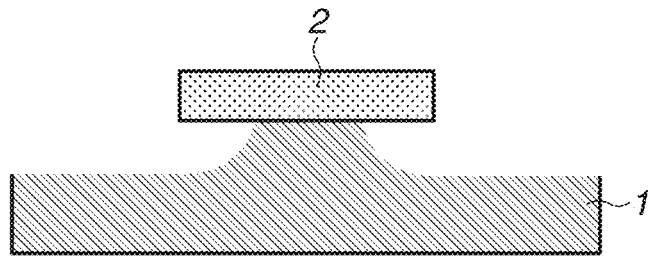
(3-3)
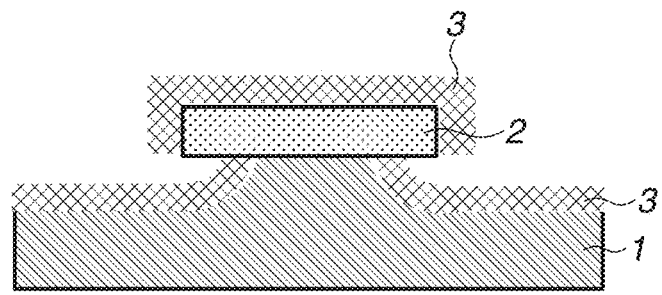
(3-4)
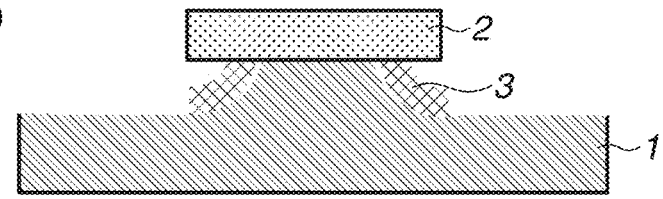
(3-5)
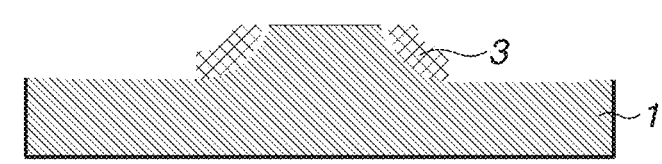

IMPRINT MOLD, MANUFACTURING METHOD THEREOF, AND IMPRINT METHOD

BACKGROUND OF THE INVENTION

Field of the Invention

The present disclosure relates to an imprint mold used for imprinting, a manufacturing method thereof, and an imprint method.

Description of the Related Art

A photo-nanoimprinting technique has been attracting attention as a method for forming a nanosized (e.g., 1 nm or more and 1000 nm or less) micropattern (e.g., concave-convex structure). In the photo-nanoimprinting technique, a transparent imprint mold that has a concave-convex pattern formed thereon and is transparent to exposure light is bought into contact with a curable composition (resist) coated on a base substrate. After the curable composition is cured and a cured product is formed, the mold is released from the cured product, so that a cured product pattern is formed on the base substrate. The base substrate is processed using the cured product pattern as a mask, thereby forming a micropattern on the base substrate. In an imprint method, the process of forming a cured product pattern at a desired position on a wafer is repeatedly performed while a mold is moved on the wafer.

A mold used for the photo-nanoimprinting technique is generally formed by processing quartz glass. Specifically, a convex mesa portion is formed on quartz glass and a fine concave-convex pattern is formed on a contact surface (imprint surface) to be in contact with a curable composition formed on an upper surface of the mesa portion. This concave-convex pattern is pressed against the curable composition. However, at a time when the upper surface of the mesa portion on the mold is pressed against the curable composition, the curable composition that has fluidity can move to the outside of the contact surface (imprint surface) on the upper surface of the mesa portion and run up a side wall of the mesa portion. This phenomenon is hereinafter referred to as "leaching". The mold is separated from the cured product on the wafer when the curable composition is cured. The curable composition that has leached to the side wall of the mesa portion, however, remains and adheres to the side wall. Accordingly, if the process of pressing the mold against the curable composition is repeatedly performed, the amount of curable composition that adheres to the side wall of the mesa portion gradually increases. The curable composition then drops onto the wafer at an unintended timing, which may cause a significant defect on the wafer (Japanese Patent No. 6441181).

Japanese Patent No. 6441181 discusses an imprint mold that prevents a curable composition from adhering to a side wall of the imprint mold.

Japanese Patent No. 6441181 discusses a technique for forming a protective layer made of a CF-based material containing carbon and fluorine and making the side wall of the mesa portion liquid repellent against the curable composition. Leaching is less likely to occur as the side wall of the mesa portion is made liquid repellent, that is, as a contact angle with respect to the curable composition increases.

In an imprint method, a cleaning step may be desirably carried out periodically under strict conditions that the mold is cleaned using acid aqueous solution, alkaline aqueous solution, or plasma every time a predetermined number of imprint processes are carried out so that residues of the curable composition adhering to the imprint surface can be removed. It is considered that the CF-based material containing carbon and fluorine as discussed in Japanese Patent No. 6441181 is not durable to the cleaning step under strict conditions for removing an organic material such as a curable composition.

SUMMARY OF THE INVENTION

The present disclosure is directed to providing an imprint mold including a mesa side wall liquid repellent surface that exhibits liquid repellency (high contact angle) with respect to a curable composition and is highly durable to a cleaning step, a manufacturing method of the mold, and an imprint method.

According to an aspect of the present disclosure, an imprint mold includes a mesa portion projecting from a base material. The mesa portion includes a contact surface configured for contact with a curable composition made of an organic material, and a surface of a side wall at which the contact surface projects from the base material. A liquid repellent surface is formed on at least the surface of the side wall. The liquid repellent surface has a contact angle with respect to the curable composition being higher than a contact angle of the contact surface. The liquid repellent surface includes at least one type of compound selected from the group consisting of an oxide of an inorganic element, a fluoride of an inorganic element, and a nitride of an inorganic element.

Further features of the present disclosure will become apparent from the following description of exemplary embodiments with reference to the attached drawings.

BRIEF DESCRIPTION OF THE DRAWINGS

FIGS. 2(2-1) to (2-5) are diagrams illustrating a method for forming a liquid repellent film according to the exemplary embodiment of the present disclosure.

FIGS. 3(3-1) to (3-5) are diagrams illustrating a method for forming a liquid repellent film according to the exemplary embodiment of the present disclosure.

DESCRIPTION OF THE EMBODIMENTS

Exemplary embodiments of the present disclosure will be described in detail below with reference to the accompanying drawings as needed. However, the present invention is not limited to the following exemplary embodiments. In addition, appropriate modifications, improvements, and the like which are made on the following exemplary embodiments based on the general knowledge of a person skilled in the art without departing from the scope of the present disclosure are also be included in the present invention.
<Shape of Mold>

A mold used for nanoimprinting is formed with a shape in which a contact surface of the mold has a surrounding side wall surface and projects from a mold base material so as to prevent a processed substrate (e.g., wafer) and a mold substrate other than the contact surface (imprint surface) from contacting each other, even when the parallelism between the mold and the processed substrate (wafer) is not complete. A convex portion on which the contact surface is formed is referred to as a mesa portion. The convex portion is a plateau portion which is formed of the contact surface as an upper surface and a side wall surface.

With this configuration, a certain clearance is ensured between the processed substrate and the mold surface other than the imprint surface of the mold during imprinting, thereby making it possible to prevent the processed surface and the mold surface from contacting each other.

Figure 1:
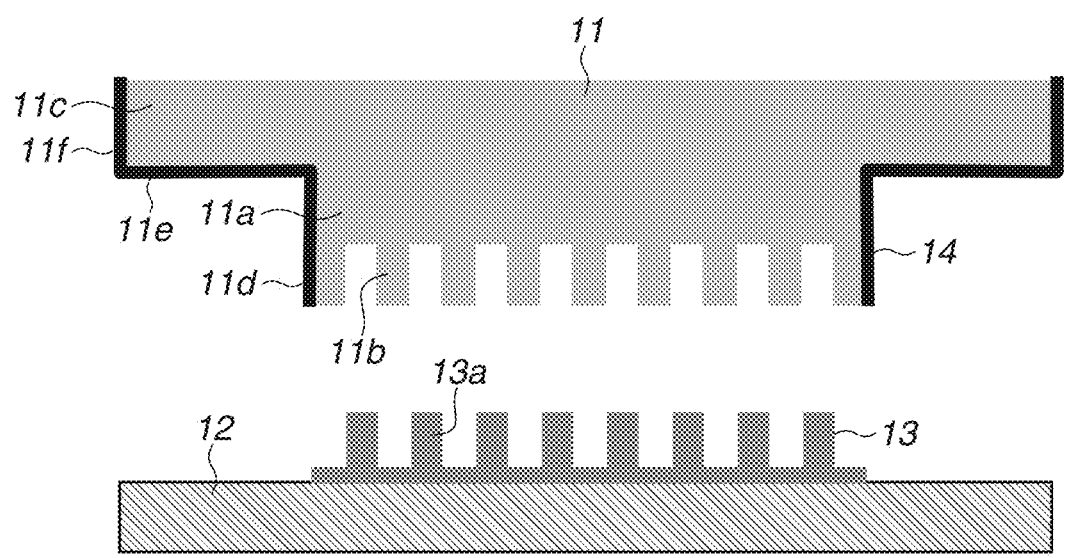
FIG. 1 is a sectional view illustrating an imprint mold according to an exemplary embodiment of the present disclosure.

FIG. 1 is a sectional view illustrating a typical imprint mold according to an exemplary embodiment of the present disclosure. A shape of a mold according to the exemplary embodiment of the present disclosure will be described below with reference to FIG. 1. When a mold 11 is pressed against a curable composition 13 placed on a wafer 12, the process of forming a liquid repellent surface which is liquid repellent to an organic substance on a side wall of the mold 11 is performed so as to prevent the curable composition 13, which is an organic material, from running up the side wall of the mold 11.

As the liquid repellent surface, a liquid repellent layer is preferably formed by, for example, sputtering. A configuration in which a liquid repellent layer including a liquid repellent surface will be mainly described below. A liquid repellent layer 14 is a film (liquid repellent layer) with a contact angle with respect to the curable composition 13, the angle being higher than that of a surface material (e.g., quartz) of the mold on which the liquid repellent layer 14 is formed. The material of the liquid repellent layer 14 and a method for forming the liquid repellent layer 14 will be described below.

As illustrated in FIG. 1, the imprint mold 11 according to the present exemplary embodiment includes a mesa portion (convex pattern forming portion) 11a. On a lower surface (imprint surface) of the mesa portion 11a, a fine concave-convex pattern 11b is formed. When the concave-convex pattern 11b is pressed against the curable composition 13 on the wafer 12, the concave-convex pattern 11b is transferred to the curable composition 13 and a curable composition pattern 13a is formed. The side wall of the mold 11 is provided with the liquid repellent layer 14 so as to prevent the curable composition 13 from moving to the outside of the imprint surface and running up and adhering to the side wall of the mold 11 when the concave-convex pattern 11b on the mold 11 is pressed against the curable composition 13. The liquid repellent layer 14 may be formed not only on the side wall of the mesa portion 11a, but also on a side wall of a base portion 11c of the base material that supports the mesa portion 11a. Advantageous effects can be obtained simply by forming the liquid repellent layer 14 on the side wall of the mesa portion 11a. Alternatively, the liquid repellent layer 14 may be formed on the base portion 11c.

More specifically, the first surface 11e and the second surface 11f are each formed on the liquid repellent layer 14. The base portion 11c includes a first surface 11e and a second surface 11f. The first surface 11e is connected to the side wall of the mesa portion 11a and extends in a direction intersecting with a side wall 11d of the mesa portion 11a. The second surface 11f is connected to the first surface 11e and extends in a direction intersecting with the first surface 11e. Thus, the liquid repellent layer 14 is formed on the entire side wall of the mold 11.

In a case of forming the liquid repellent layer 14 on the side wall of the mold 11, it may be desirable to prevent the liquid repellent layer 14 from being formed on the imprint surface. This is because an unfilled defect of the curable composition 13 may occur if the liquid repellent layer 14 is formed on the imprint surface. Even on the imprint surface, as long as a width of the liquid repellent layer 14 is within a range of several μm to several mm of an outer peripheral portion, the formation of the liquid repellent layer 14 may be allowed.

<Material for Liquid Repellent Layer>

As a material for the liquid repellent layer 14, a material that exhibits a contact angle of 5° or more with respect to the curable composition 13, which is an organic material, even after a mold cleaning step is used as described below. As a material for the liquid repellent layer 14, a material is selected of which a contact angle with respect to the curable composition 13 on the liquid repellent layer 14 is larger than a contact angle with respect to a surface material, such as a curable composition on quartz, of the concave-convex pattern 11b.

Many of organic materials containing carbon atoms can react with oxygen plasma and be vaporized or altered. Accordingly, a material containing no carbon atoms is preferably used as a material for the liquid repellent layer 14.

An inorganic compound that can form a surface having liquid repellency with respect to an organic material may be used. As a material for such an inorganic compound, an oxide of an inorganic element, a fluoride of an inorganic element, or a nitride of an inorganic element, or a mixture thereof can be used in the present exemplary embodiment.

Examples of an oxide of an inorganic element include an oxide of hafnium (Hf), an oxide of zirconium (Zr), an oxide of yttrium (Y), an oxide of tantalum (Ta), an oxide of niobium (Nb), an oxide of lanthanum (La), an oxide of cerium (Ce), an oxide of praseodymium (Pr), an oxide of neodymium (Nd), an oxide of promethium (Pm), an oxide of samarium (Sm), an oxide of europium (Eu), an oxide of gadolinium (Gd), an oxide of terbium (Tb), an oxide of dysprosium (Dy), an oxide of holmium (Ho), an oxide of erbium (Er), an oxide of thulium (Tm), an oxide of ytterbium (Yb), and an oxide of lutetium (Lu).

Examples of a fluoride of an inorganic element include a fluoride of chromium (Cr), a fluoride of calcium (Ca), a fluoride of magnesium (Mg), a fluoride of titanium (Ti), a fluoride of aluminum (Al), a fluoride of yttrium (Y), and a fluoride of nickel (Ni).

Examples of a nitride of an inorganic element include a nitride of silicon (Si), a nitride of germanium (Ge), a nitride of boron (B), and a nitride of aluminum (Al).

As discussed in Japanese Patent Application Laid-Open No. 2009-45925, a quartz surface doped with fluorine atoms can also be used as a material for the liquid repellent layer 14.

Among the materials described above, an oxide of an inorganic element can be preferably used in the present exemplary embodiment. This is because an oxide of an inorganic element is a reaction product between an inorganic element and oxygen, and thus has low reactivity with oxygen plasma or oxidative liquid and exhibits a high resistance (oxygen plasma cleaning resistance) to a cleaning step described below.

Among the above-described examples of an oxide of an inorganic element, the following oxide can be particularly preferably used: an oxide of cerium (Ce), an oxide of praseodymium (Pr), an oxide of neodymium (Nd), an oxide of samarium (Sm), an oxide of europium (Eu), an oxide of gadolinium (Gd), an oxide of terbium (Tb), an oxide of dysprosium (Dy), an oxide of holmium (Ho), an oxide of erbium (Er), an oxide of thulium (Tm), an oxide of ytterbium (Yb), and an oxide of lutetium (Lu).

The above-described materials exhibit a contact angle in a range from 98° to 115° with respect to water (surface tension of 72.8 mN/m) as discussed in G. Azimi, R. Dhiman, H-M. Kwon, A. T. Paxson, K. K. Varanasi, NATURE MATERIALS, 12, 315-320 (2013). As a result of another study, the inventors of the present disclosure found that a surface having a contact angle of 93° or more with respect to water exhibited a high contact angle with respect to a liquid with a surface tension of about 30 mN/m. Specifically, the inventors of the present disclosure have found that a surface having a contact angle in a range from 93° to 118° with respect to water exhibited a contact angle in a range from 22° to 82° with respect to a liquid with a surface tension of about 30 mN/m. Accordingly, it is expected that a curable composition for photo-nanoimprinting having a surface tension of about 30 mN/m or more exhibits a contact angle of about 22° to 82° on the surface of the above-described materials. On a quartz surface usually used for photo-nanoimprinting, many curable compositions for photo-nanoimprinting exhibit a contact angle of 0°.

<Liquid Repellent Layer Forming Method>

To form a thin film as a liquid repellent film, two methods are available: a liquid-phase film formation method, and a vapor-phase film formation method.

Liquid-phase film formation methods enable formation of a thin film with a uniform thickness on a large substrate or a substrate with a complicated shape by using a relatively inexpensive manufacturing apparatus. Examples of liquid-phase film formation methods include a sol-gel method, a plating method, and a coating method.

On the other hand, vapor-phase film formation methods require a vacuum apparatus and thus uses a relatively expensive apparatus. However, vapor-phase film formation methods are excellent in, for example, controllability of impurities, controllability of a film thickness, and a degree of freedom of selecting materials. Vapor-phase film formation methods are roughly divided into physical vapor deposition (PVD) methods and chemical vapor deposition (CVD) methods.

The two methods differ from each other mainly in terms of material. PVD methods uses a substance constituting a thin film as a material, while the CVD methods use a compound containing an element that is not eventually taken into a thin film as a material. Accordingly, a material used for a PVD method is supplied in a form of solid such as metal, and ceramics in powder, particles, and plates. While a material used for CVD methods is supplied in a form of gas, liquid, solution, or the like containing material molecules.

A PVD method uses a pressure lower than that used in the CVD method to perform film deposition. For the deposition, a vacuum deposition method and a sputtering method are practically used. The vacuum deposition method and the sputtering method use heat and ions, respectively, in a decomposition/evaporation process. A sputtering method that uses ions requires introduction of gas, which leads to an increase in a pressure during film formation as compared with a vacuum deposition method. On the other hand, CVD methods are roughly divided into thermal CVD methods and plasma CVD methods, which require a chemical reaction in a process of transporting material vapor. Accordingly, a CVD method uses a pressure having an order of magnitude higher than that used in a PVD method.

In the present exemplary embodiment, a liquid repellent film is formed on a mesa side surface to prevent the curable composition from moving to the outside of the mesa portion (imprint surface) and leaching to the mesa side surface during imprinting. Steps of forming the liquid repellent layer will be described with reference to FIGS. 2(2-1) to (2-5), FIGS. 3(3-1) to (3-5), and FIGS. 4(4-1) to (4-7).

<Liquid Repellent Layer Forming Method 1>

FIG. 2(2-1) illustrates that a chrome film 2 is formed on a mold substrate 1. On an entire surface of the mold substrate 1, chrome is deposited. A curable composition film is then formed only on a region where a mesa portion is formed, and the chrome is etched by the curable composition film as a mask. Thereafter, the curable composition film is removed to thereby form the chrome film 2 corresponding to the mesa region on the mold substrate 1 as illustrated in FIG. 2(2-1).

The mold substrate 1 is anisotropically etched using the chrome film 2 as a mask. In general, the mold substrate is anisotropically etched using CF-based gas by a dry etching apparatus having a parallel plate electrode. FIG. 2(2-2) illustrates a shape of the etched mold substrate 1.

Thereafter, a liquid repellent film 3 is formed on the entire surface of the mold substrate 1 on which the chrome film 2 is formed. As described above, methods of film formation include a vapor-phase film formation method and a liquid-phase film formation method. Either one of the film formation methods may be used. FIG. 2(2-3) illustrates a state where the formation of the liquid repellent film 3 is complete.

Anisotropic etching is then carried out using gas with which the formed liquid repellent film 3 can be etched to remove the liquid repellent film 3 that is attached to the upper surface and side surfaces of the chrome film 2 and the plane of the mold substrate 1. In this case, as illustrated in FIG. 2(2-4), etching conditions are adjusted such that only the liquid repellent film 3 attached to the side surfaces of the mesa portion on the mold substrate 1 is left.

Lastly, the chrome film 2 is removed and a blank mold is completed. The liquid repellent film 3 is formed only on the side surfaces of the blank mold as illustrated in FIG. 2(2-5).

<Liquid Repellent Layer Forming Method 2>

Next, FIGS. 3(3-1) to (3-5) will be described. A process flow for forming the liquid repellent film 3 is similar to that illustrated in FIGS. 2(2-1) to (2-5). FIGS. 2(2-1) to (2-5) differ from FIGS. 3(3-1) to (3-5) in that a dry etching method is used to etch the mold substrate 1 to form a mesa portion in the process flow illustrated in FIGS. 2(2-1) to (2-5), while a wet etching method is used in the process flow illustrated in FIGS. 3(3-1) to (3-5).

FIG. 3(3-1) illustrates that the chrome film 2 is formed on the mold substrate 1. On the entire surface of the substrate 1, chrome is deposited. A curable composition film is then formed only on a region where the mesa portion is formed, and the chrome film 2 is etched by the curable composition film as a mask. Thereafter, the curable composition film is removed to thereby form the chrome film 2 corresponding to the mesa region on the mold substrate 1 as illustrated in FIG. 3(3-1).

The mold substrate 1 is then isotropically wet-etched using the chrome film 2 described above as a mask. The mold substrate 1 is isotropically wet-etched using, for example, hydrofluoric acid (HF) solution. FIG. 3(3-2) illustrates a shape of the etched mold substrate 1.

Thereafter, the liquid repellent film 3 is formed on the entire surface of the mold substrate 1 on which the chrome film 2 is formed. As described above, methods of film formation include a vapor-phase film formation method and a liquid-phase film formation method. Either one of the film formation methods may be used. FIG. 3-3 illustrates a state where the film formation is complete.

Anisotropic etching is then carried out using gas with which only the liquid repellent film 3 can be selectively etched to remove the liquid repellent film 3 that is attached to the upper surface and side surfaces of the chrome film 2 and the plane of the mold substrate 1 (FIG. 3(3-4)). Lastly, the chrome film 2 is removed and a blank mold is completed. The liquid repellent film 3 is formed only on the side surfaces of the blank mold as illustrated in FIG. 3(3-5).

<Liquid Repellent Layer Forming Method 3>

Next, FIGS. 4(4-1) to (4-7) will be described. A process flow for forming the liquid repellent film 3 is similar to that illustrated in FIGS. 2(2-1) to (2-5). FIGS. 2(2-1) to (2-5) differ from FIGS. 4(4-1) to (4-7) in that the liquid repellent film 3 is formed on the side surfaces of the mesa portion in the process flow illustrated in FIGS. 2(2-1) to (2-5), while the liquid repellent film 3 is formed on an edge portion of the mesa portion in the process flow illustrated in FIGS. 4(4-1) to (4-7).

Figure 4:
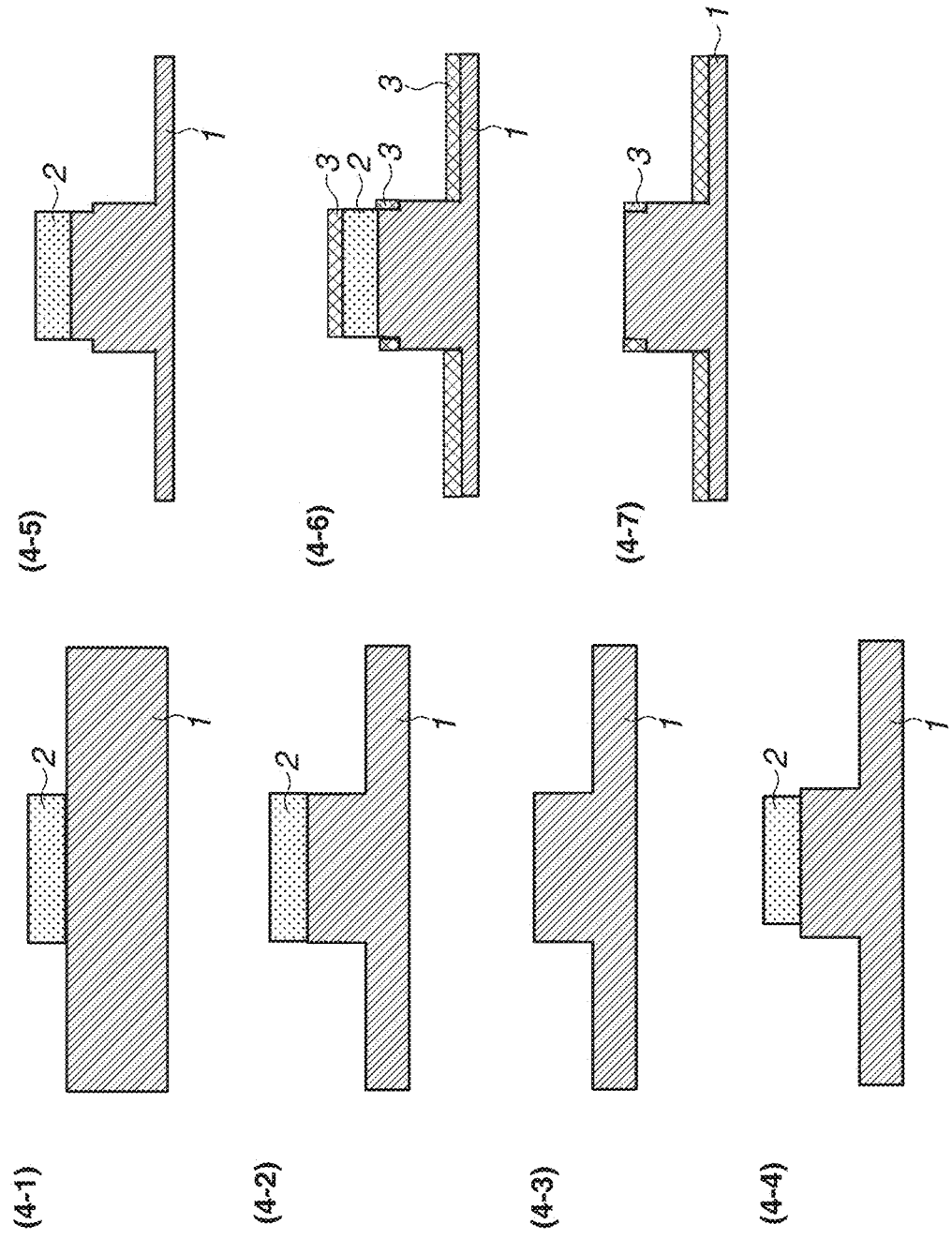
FIGS. 4(4-1) to (4-7) are diagrams illustrating a method for forming a liquid repellent film according to the exemplary embodiment of the present disclosure.

FIG. 4(4-1) illustrates that the chrome film 2 is formed on the mold substrate 1. On the entire surface of the mold substrate 1, chrome is deposited. A cured product film of a curable composition is then formed only on a region where the mesa portion is formed, and the chrome film 2 is etched by the cured product film as a mask. Thereafter, the cured product is removed to thereby form the chrome film 2 corresponding to the mesa region on the mold substrate 1 as illustrated in FIG. 4(4-1). Next, the mold substrate 1 is etched using the chrome film 2 as a mask. As an etching method, an anisotropic etching method or an isotropic etching method may be used. Anisotropic etching methods use, in general, CF-based gas and a dry etching apparatus including a parallel plate electrode. Isotropic wet etching methods use, for example, hydrofluoric acid (HF) solution. FIG. 4(4-2) illustrates a shape of the mold substrate 1 etched by a dry etching method. Thereafter, the chrome film 2 is removed (FIG. 4-3). Next, as illustrated in FIG. 4(4-4), the chrome film 2 is formed in a region excluding an outer peripheral portion with a width of about 1 μm to 1 mm of the mesa surface by a method similar to that described above on the mesa surface. Thereafter, the mold substrate 1 is anisotropically etched using the chrome film 2 as a mask as illustrated in FIG. 4(4-5).

Thereafter, a liquid repellent film 3 is formed on the entire surface of the mold substrate 1 on which the chrome film 2 is formed. As described above, methods of film formation include a vapor-phase film formation method and a liquid-phase film formation method. Either one of the film formation methods may be used. However, a directional film formation method is used to prevent the film from adhering to the side surfaces. The thickness of the film to be formed is set to be equal to the thickness of the etched portion illustrated in FIG. 4(4-5).

Thereafter, the chrome film 2 illustrated in FIG. 4(4-6) is removed by a lift-off method, so that only a portion of the liquid repellent film 3 that is located at an upper portion of the chrome film 2 can be removed as illustrated in FIG. 4(4-7), and the other portion of the liquid repellent film 3 can be left on the mold substrate 1. Thus, a blank mold in which the liquid repellent film 3 is formed only on edge faces of the mesa portion is completed as illustrated in FIG. 4-5.

Figure 5:
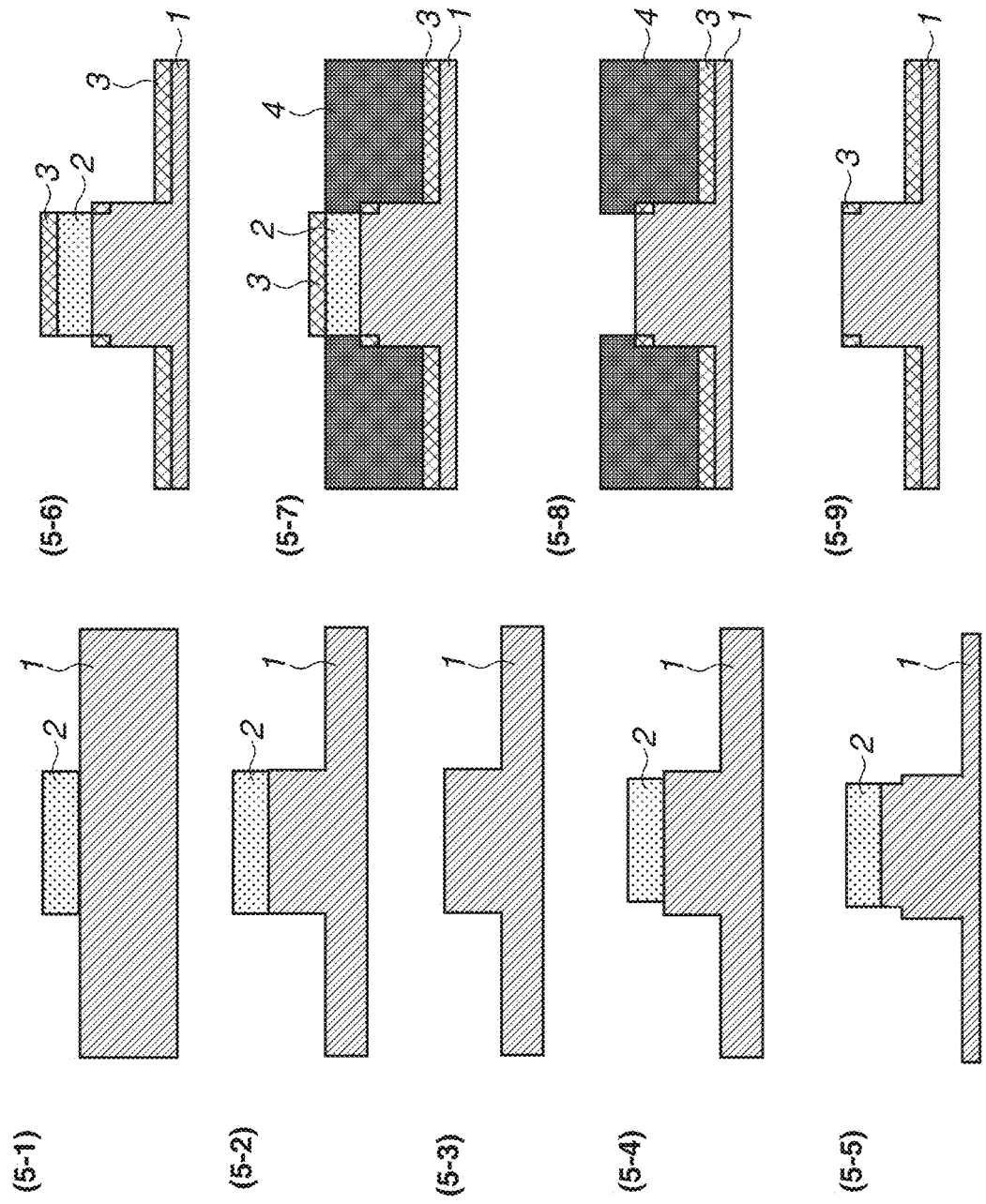
FIGS. 5(5-1) to (5-9) are diagrams illustrating a method for forming a liquid repellent film according to the exemplary embodiment of the present disclosure.
Figure 6:
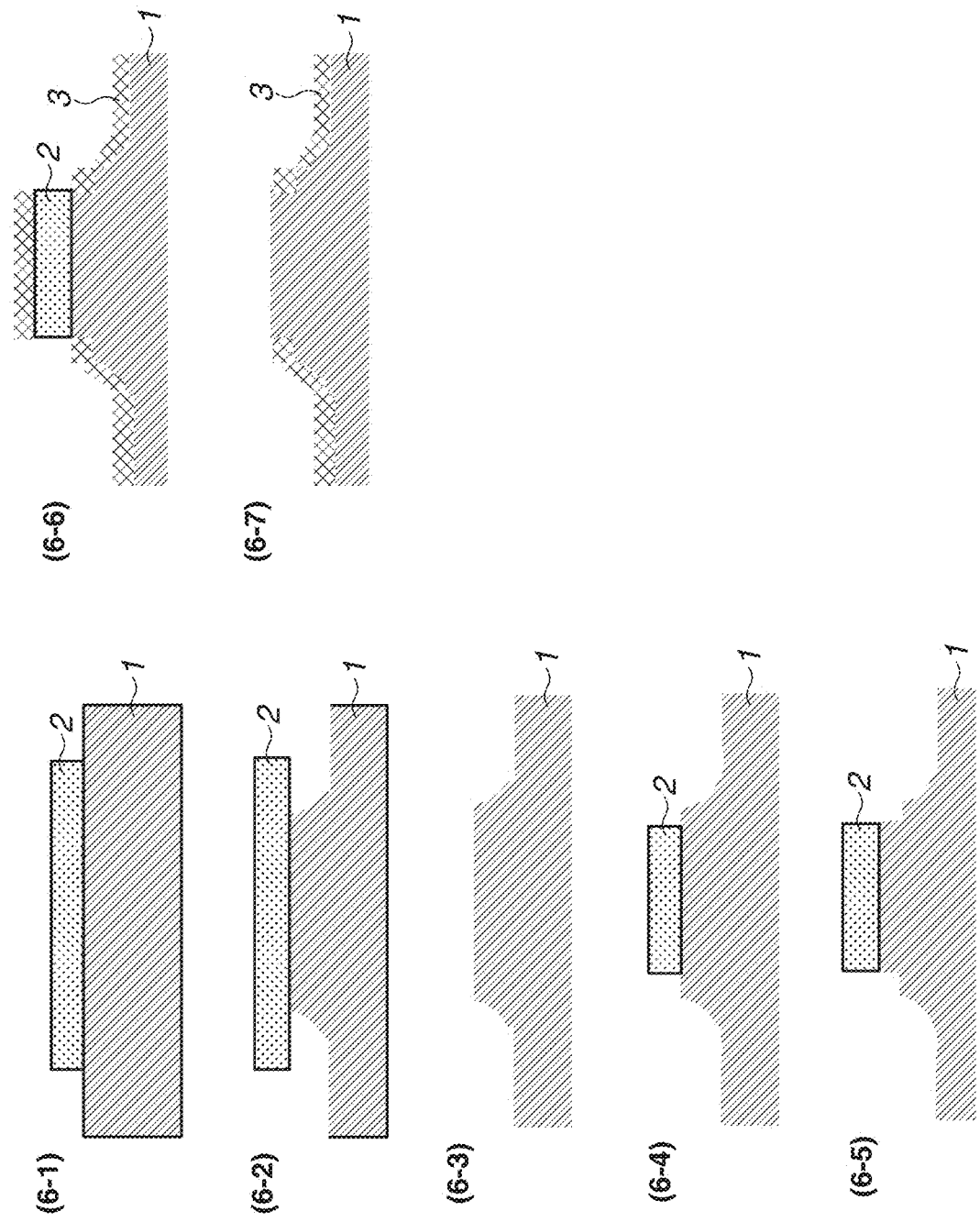
FIGS. 6(6-1) to (6-7) are diagrams illustrating a method for forming a liquid repellent film according to the exemplary embodiment of the present disclosure.
Figure 7:
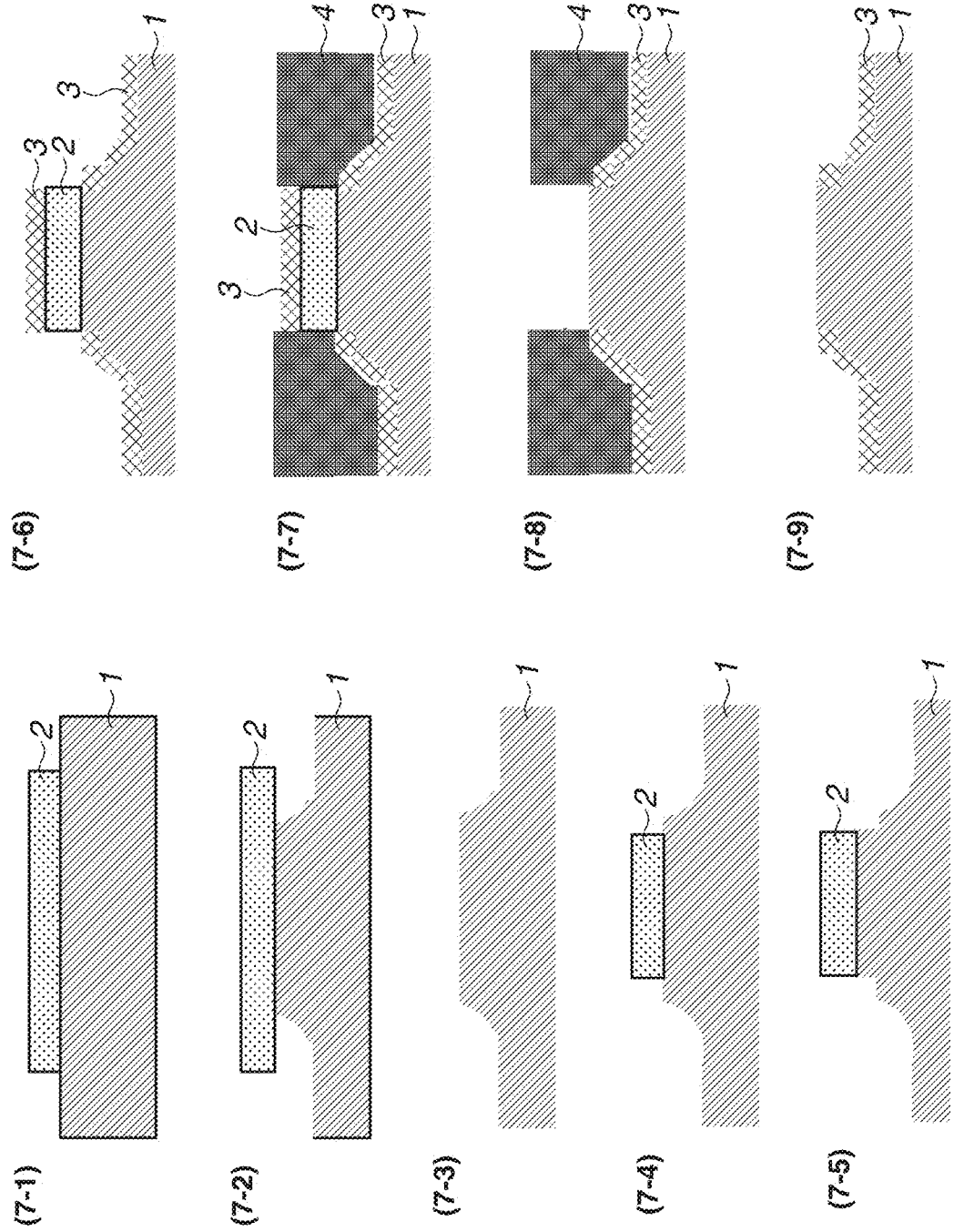
FIGS. 7(7-1) to (7-9) are diagrams illustrating a method for forming a liquid repellent film according to the exemplary embodiment of the present disclosure.

A method using a curable composition pattern, which is different from the lift-off method, in a process flow illustrated in FIGS. 4(4-6) and (4-7) is illustrated in FIGS. 5(5-1) to (5-9). FIGS. 5(5-1) to (5-6) are similar to FIGS. 4(4-1) to (4-6), respectively. After a process performed in FIG. 5(5-6), a curable composition pattern 4 is formed to surround the peripheral portion of the chrome film 2 as illustrated in FIG. 5-7. The liquid repellent film 3 and the chrome film 2 are removed by etching using the curable composition pattern 4 as a mask (FIG. 5(5-8)). The curable composition pattern 4 is then removed to thereby obtain the shape illustrated in FIG. 5(5-9). FIG. 5(5-9) is similar to FIG. 4(4-7). This explains that a plurality of methods can be used to remove the liquid repellent film 3 and the chrome film 2 on the mesa surface.

<Liquid Repellent Layer Forming Method 4>

In FIGS. 4(4-1) to (4-7) and FIGS. 5(5-1) to (5-9), a dry etching method is used as a method for etching the mold substrate 1. FIGS. 6(6-1) to (6-7) and FIGS. 7(7-1) to (7-9) illustrate a method for processing the mold substrate 1 by a wet etching method.

In FIGS. 6(6-1) to (6-7), instead of using a dry etching method, a wet etching method is used as a method for etching the mold substrate 1 illustrated in the process flow of FIGS. 4(4-1) to (4-7). After this, the liquid repellent film 3 and the chrome film 2 are removed by a lift-off method. An isotropic wet etching method uses, for example, hydrofluoric acid (HF) solution.

In FIGS. 7(7-1) to (7-9), instead of using a dry etching method, a wet etching method is used as a method for etching the mold substrate 1 illustrated in the process flow of FIGS. 5(5-1) to (5-9). After the process flow, the liquid repellent film 3 and the chrome film 2 are removed by a curable composition pattern method.

<Method for Forming Micropattern on Mold>

Figure 8:
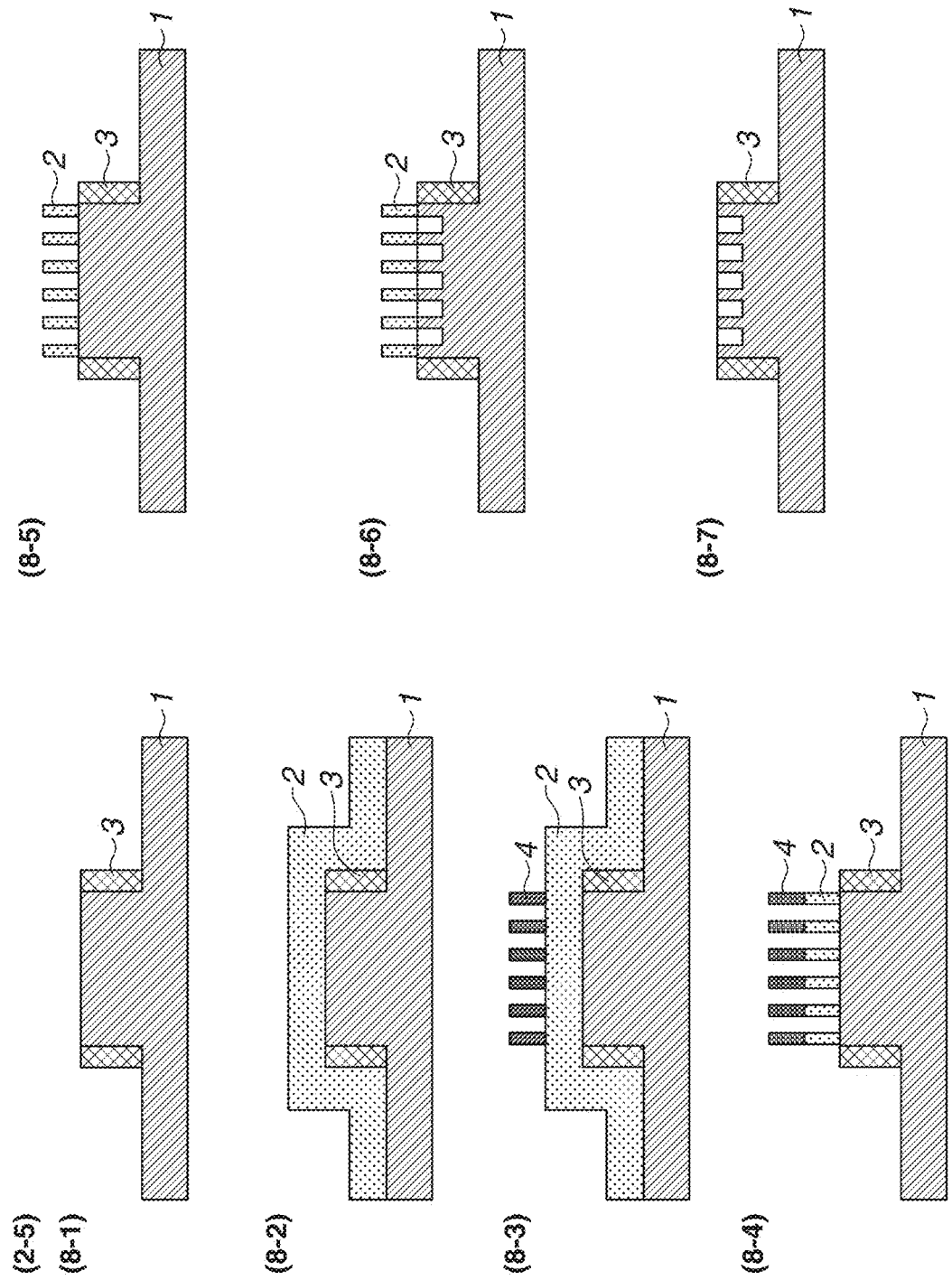
FIGS. 8(8-1) to (8-7) are diagrams illustrating a method for forming a micropattern on an imprint mold according to the exemplary embodiment of the present disclosure.
Figure 9:
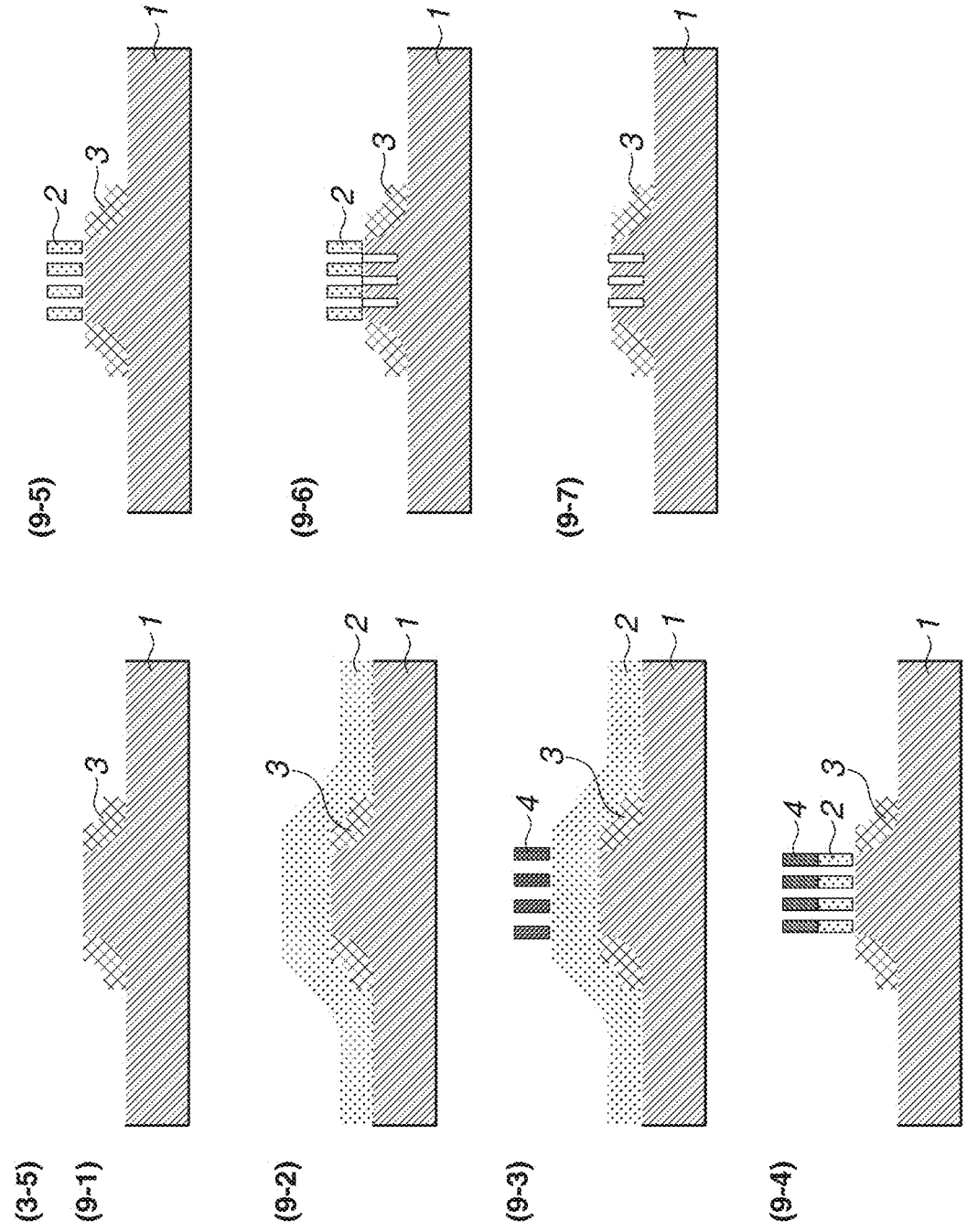
FIGS. 9(9-1) to (9-7) are diagrams illustrating a method for forming a micropattern on the imprint mold according to the exemplary embodiment of the present disclosure.
Figure 10:
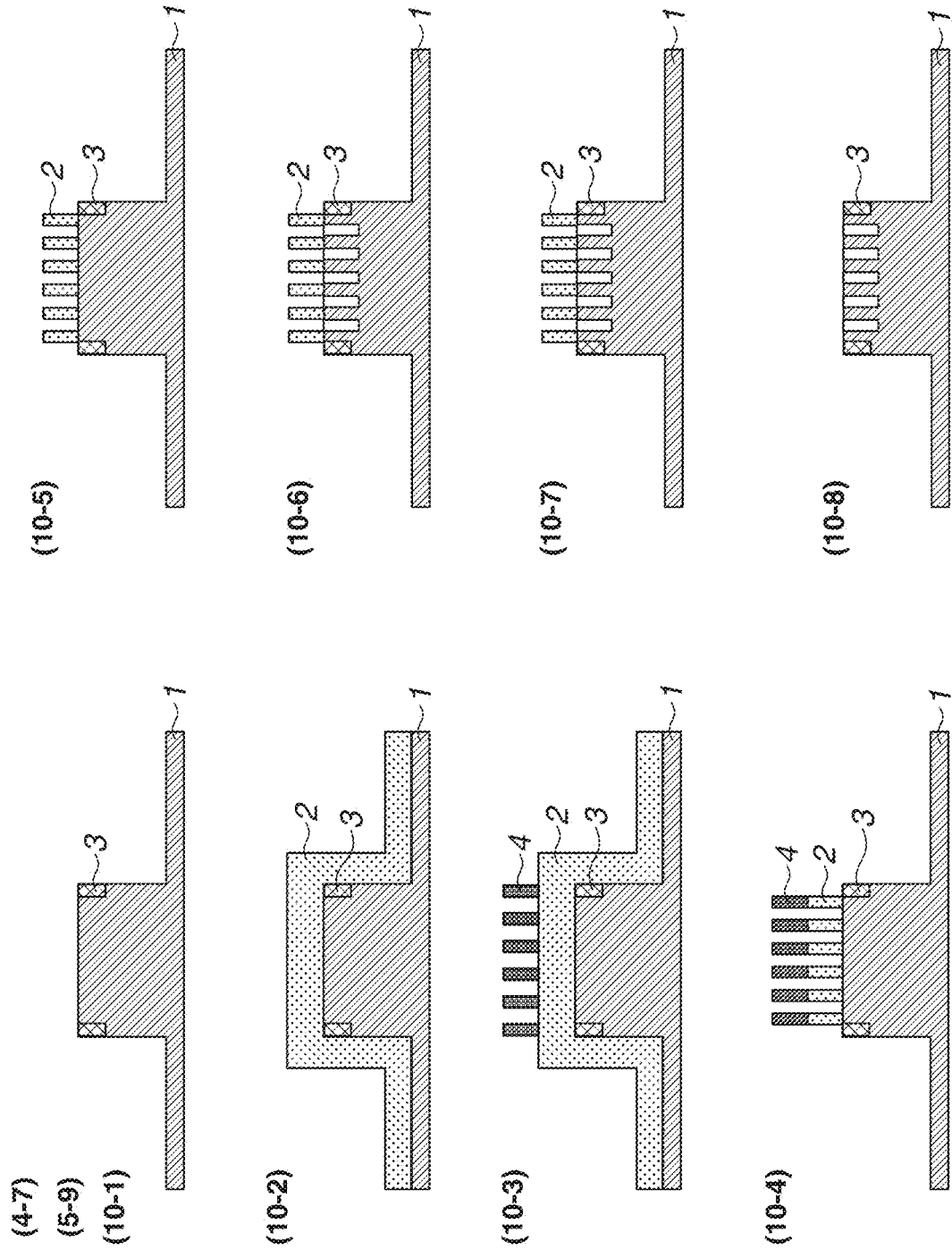
FIGS. 10(10-1) to (10-8) are diagrams illustrating a method for forming a micropattern on the imprint mold according to the exemplary embodiment of the present disclosure.
Figure 11:
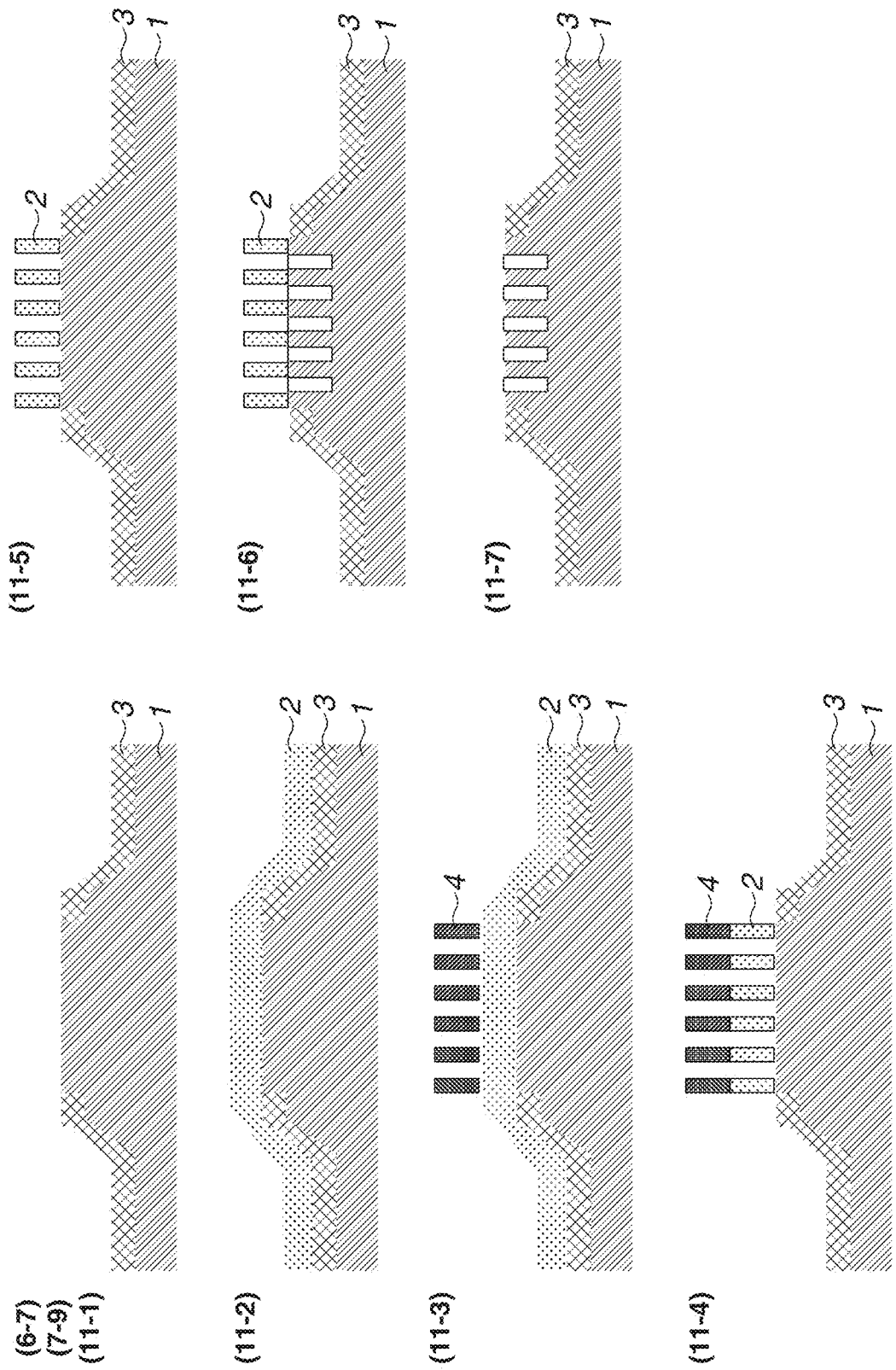
FIGS. 11(11-1) to (11-7) are diagrams illustrating a method for forming a micropattern on the imprint mold according to the exemplary embodiment of the present disclosure.

FIGS. 8(8-1) to (8-7), 9(9-1) to (9-7), 10(10-1) to (10-7), and 11(11-1) to (11-7) illustrate an example of a process flow for forming a micropattern on the imprint surface of the mold substrate on which the liquid repellent film is formed on the side surfaces of the mesa portion. Although these Figures illustrate the same process flow as described above, these Figures differ from each other as follows. That is, FIGS. 8(8-1) to (8-7) illustrate a case where the mesa portion of the mold substrate are formed in a vertical shape by an anisotropic etching method, and the liquid repellent film is formed on the side surfaces of the mesa portion. FIGS. 9(9-1) to (9-7) illustrate a case where the side surfaces of the mesa portion are formed in a round shape by wet etching, and the liquid repellent film is formed on the side surfaces of the mesa portion. FIGS. 10(10-1) to (10-7) illustrate a case where the liquid repellent film is formed on the outer peripheral portion of the imprint surface on the mesa portion by anisotropically etching the mesa portion on the mold substrate. FIGS. 11(11-1) to (11-7) illustrate a case where the side surfaces of the mesa portion on the mold substrate are formed with a round shape by a wet etching method, and the liquid repellent film is formed on the outer peripheral portion of the imprint surface on the mesa portion.

A case where a mold with no micropattern formed on the imprint surface is used to obtain a flat surface of a curable composition is also included in the present disclosure.

FIGS. 8(8-1) to (8-7) illustrate an example of a process flow for forming a micropattern on the imprint surface of the mold substrate 1 formed on the side surfaces of the mesa portion illustrated in FIGS. 2(2-1) to (2-5). FIG. 8(8-1) is similar to FIG. 2(2-5), and illustrates that the liquid repellent film 3 is formed on mold side surfaces. After a process performed in FIG. 8(8-1), the chrome film 2 is formed on the entire surface of the mold as illustrated in FIG. 8-2, and the curable composition pattern 4 is formed on the chrome film 2 as illustrated in FIG. 8(8-3). The base chrome film 2 is etched using the curable composition pattern 4 as a mask (FIG. 8-4). After that, the curable composition pattern 4 is removed to thereby form the chrome pattern (chrome film) 2 as illustrated in FIG. 8-5. Next, the mold substrate 1 is etched using the chrome pattern 2 as a mask (FIG. 8-6), thereby forming the micropattern on the mold surface (mesa surface). Lastly, the chrome pattern 2 is removed as illustrated in FIG. 8-7, and the liquid repellent film 3 is formed on the side surfaces of the mesa portion of the mask to be finally required. Thus, a mold in which the micropattern is formed on the imprint surface is completed.

Like in FIGS. 8(8-1) to (8-7), FIGS. 9(9-1) to (9-7), FIGS. 10(10-1) to (10-8), and FIGS. 11(11-1) to (11-7) illustrate examples of process flows as follows: FIGS. 9(9-1) to (9-7) illustrate an example of a process flow for forming a micropattern on the imprint surface of the mold on which the liquid repellent film 3 is formed on the side surfaces of the mesa portion illustrated in FIGS. 3-1 to 3-5, FIGS. 10(10-1) to (10-7) illustrate an example of a process flow for forming a micropattern on the imprint surface of the mold on which the liquid repellent film 3 is formed at edge end faces of the mesa portion illustrated in FIGS. 4(4-1) to (4-7), and FIGS. 11(11-1) to (11-7) illustrate an example of a process flow for forming a micropattern on the imprint surface of the mold on which the liquid repellent film 3 is formed at edge end faces of the mesa portion illustrated in FIGS. 5(5-1) to (5-9).

<Imprint Mold Cleaning Method>

An imprint mold cleaning method according to the present exemplary embodiment will be described. A small number of components of the curable composition can adhere to the imprint surface of the mold on which a mold contact step and a mold release step, which are described below, are repeatedly performed. The curable composition adhering and cured in the mold pattern may cause continuous defects on the processed substrate during the subsequent imprint process. If the curable composition adhering and cured in the mold drops onto the processed substrate and the substrate is imprinted by the mold, the mold pattern can be broken, which causes a common defect of repeatedly imprinting a pattern different from an originally designed pattern. This may cause a reduction in the production yield of a product.

Accordingly, it is desirable to periodically clean the mold to prevent a defective portion from being transferred during imprinting. In general, to remove and clean the curable composition of the mold to which the curable composition adheres, a dry cleaning method and a wet cleaning method can be used. Cleaning is performed using one or both of these methods.

In a dry cleaning according to the present exemplary embodiment, the curable composition and plasmatized gas are caused to react with each other, thereby vaporizing and removing the curable composition. In this case, oxygen plasma is usually used. The curable composition is composed of carbon, oxygen, and hydrogen. When the curable composition reacts with oxygen plasma, carbon, oxygen, and hydrogen become $CO_2$, $H_2O$, $O_2$, respectively, which are gases that can be removed. Instead of using oxygen plasma, ozone may be used to perform dry cleaning. The ozone's case basically uses a same principle as oxygen plasma's case. The curable composition that has reacted with ozone ($O_3$) becomes $CO_2$, $H_2O$, and $O_2$, which are gases that can be vaporized and removed. Hydrogen plasma, nitrogen plasma, and argon plasma may be included in the gas. To prevent deterioration in the productivity of an imprint apparatus using a mold, for example, simple cleaning for simply exposing the mold to atmospheric plasma for several minutes to about 10 minutes may be performed using atmospheric plasma, unlike dry cleaning described above.

If the curable composition contains impurities such as metal, the impurities are preferably removed by wet cleaning after dry cleaning, because a metal oxide is not vaporized. As a wet cleaning method, alkaline cleaning containing an alkaline compound, such as choline, sulfuric acid/hydrogen peroxide mixture (SPM) cleaning, or the like is usually used. In SPM cleaning, the mold is immersed in mixed solution of sulfuric acid ($H_2SO_4$) solution and hydrogen peroxide solution ($H_2O_2$) with a ratio of $H_2SO_4:H_2O_2=4:1$ for, for example, about 10 minutes at 100° C. to 120° C., thereby removing organic contaminants and metal contaminants.

The above-described cleaning methods can be combined. For example, a combination of wet cleaning, dry cleaning, and wet cleaning may be carried out in this order. In this case, cleaning methods are, for example, SPM cleaning, oxygen plasma cleaning, and choline cleaning in this order.

The liquid repellent film used in the present exemplary embodiment exhibits a high resistance to the above-described cleaning step. It is considered that a CF-based material containing carbon and fluorine as discussed in Japanese Patent No. 6441181 is not durable to the above-described cleaning step to remove an organic material, such as a curable composition. On the other hand, an oxide of an inorganic element, a fluoride of an inorganic element, or a nitride of an inorganic element, or a mixture thereof used in the present exemplary embodiment has low reactivity with an oxidative material, such as oxygen plasma and SPM solution, and thus exhibits a high resistance to the above-described cleaning step. An oxide of an inorganic element that is not further oxidized exhibits a higher resistance, and thus can be particularly preferably used. The resistance to the cleaning step herein described indicates that the contact angle of the liquid repellent film with respect to the curable composition after cleaning is 5° or more, and/or the contact angle of the liquid repellent film with respect to the curable composition after cleaning is higher than that of the contact surface (imprint surface).

After imprinting is carried out by an imprint method described below, an imprint mold is cleaned by the above-described cleaning method and then imprinting can be performed by reusing the cleaned imprint mold. Consequently, the imprint mold in which the liquid repellency of the side wall surface can be maintained can be continuously used without causing adhesion of a cured product or the like, and the imprint step in which leaching of the curable composition to the outer peripheral portion of the mold is suppressed can be carried out a large number of times.

<Imprint Method>

Next, steps of the imprint method according to the present exemplary embodiment will be described with reference to a schematic sectional view of FIG. 12.

A cured film of a curable composition obtained by the imprint method according to the present exemplary embodiment may desirably have a pattern with a size of 1 nm or more and 10 mm or less. A pattern formation technique for forming a film having a nanosized (e.g., 1 nm or more and 1000 nm or less) pattern using light is referred to as a photo-nanoimprinting method in general. The imprint method according to the present exemplary embodiment uses the photo-nanoimprinting method. Steps of the imprint method will be described below.

(Stacking Step)

Figure 12:
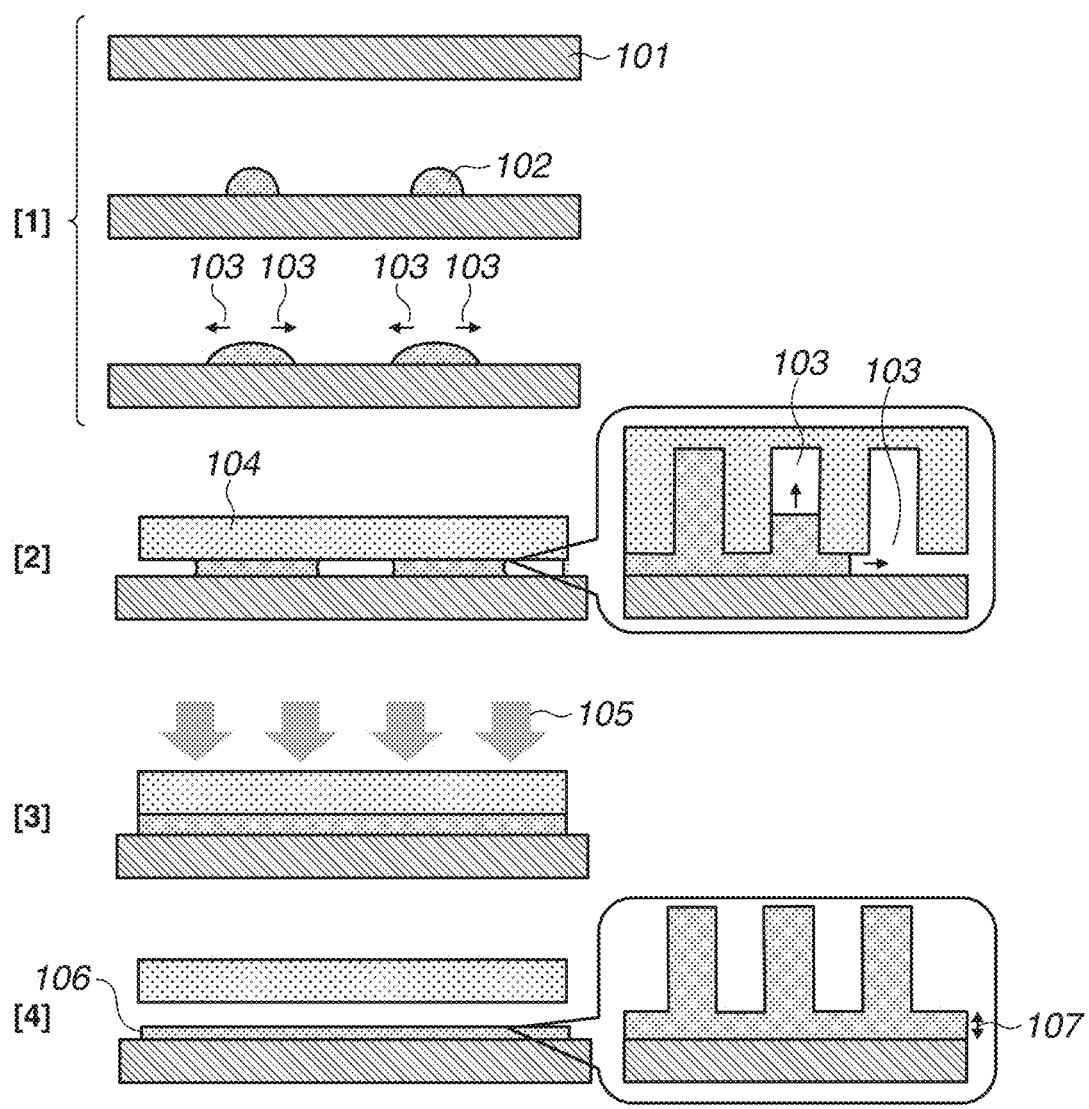
FIGS. 12[1] to [4] are schematic sectional views illustrating an imprint method according to the exemplary embodiment of the present disclosure.

In this step (stacking step), for example, droplets of a curable composition 102 are discretely dropped and arranged on a substrate 101 as illustrated in FIG. 12. As an arrangement method, an inkjet method is particularly preferably used. Droplets of the curable composition 102 are densely arranged on a substrate region opposed to a region where concave portions are densely present on the mold, and droplets of the curable composition 102 are sparsely arranged on a substrate region opposed to a region where concave portions are sparsely present. With this configuration, a residual layer described below can be controlled to have a uniform thickness regardless of whether patterns on the mold are densely or sparsely arranged.

The dropped droplets are gradually diffused on the surface of the substrate with time. Arrows 103 indicate directions in which the droplets are diffused.

In another example of this step (stacking step), the curable composition 102 may be arranged on the substrate 101 by a spin coating method. In this case, the curable composition 102 is continuously arranged on the substrate 101.

The viscosity of a mixture of components other than the solvent of the curable composition 102 according to the present exemplary embodiment at 25° C. is preferably 1 mPa·s or more and less than 40 mPa·s. More preferably, the viscosity is 1 mPa·s or more and less than 20 mPa·s. If the viscosity of the curable composition 102 exceeds 40 mPa·s, it is difficult to perform coating by the inkjet method. In the inkjet method, the residual layer can be formed with a uniform thickness by discretely arranging droplets depending on the density of desired patterns and highly accurate patterns can be formed. A viscosity lower than 1 mPa·s is not preferable because non-uniform coating may occur due to a flow of the composition during coating (arrangement), or the composition may flow from an end portion of the mold during the mold contact step described below.

The surface tension of the curable composition 102 according to the present exemplary embodiment with respect to a composition of components other than the solvent at 23° C. is preferably 5 mN/m or more and 70 mN/m or less. More preferably, the surface tension is 7 mN/m or more and 50 mN/m or less, and still more preferably 10 mN/m or more and 40 mN/m or less. In this case, as the surface tension becomes higher when the surface tension is, for example, 5 mN/m or more, a stronger capillary force acts, so that a filling (spreading and filling) process can be completed in a short period of time when the curable composition 102 is brought into contact with the mold. By setting the surface tension to 70 mN/m or less, a cured film with surface smoothness can be obtained by curing the curable composition.

The contact angle of the curable composition 102 according to the present exemplary embodiment with respect to the imprint surface and the substrate surface is preferably 0° or more and 90° or less for a composition of components other than the solvent. If the contact angle is more than 90°, a capillary force acts in a negative direction (direction in which a contact interface between the mold and the curable composition is contracted) in the mold pattern or a gap between the substrate and the mold, and thus the composition is not filled. A contact angle of 0° or more and 30° or less is particularly preferable. As the contact angle decreases, a stronger capillary force acts, and thus the composition is filled at a high filling rate.

The substrate 101 on which the curable composition 102 is arranged is a processed substrate. A silicon wafer is usually used as the substrate 101. A processed layer may be formed on the substrate 101. Another layer may be further formed between the substrate 101 and the processed layer. Further, a replica of a quartz imprint mold (mold replica) can be formed using a quartz substrate as the substrate 101.

The substrate 101, however, is not limited to a silicon wafer and a quartz substrate. The substrate 101 can be any one of substrates used for semiconductor devices such as, a titanium-tungsten alloy, an aluminum-silicon alloy, an aluminum-copper-silicon alloy, a silicon oxide, and a silicon nitride.

Adhesive properties of the surface of the substrate 101 (processed substrate) or processed layer to be used with respect to the curable composition 102 may be improved by a surface treatment such as a silane coupling process, a silazane process, or an organic thin film formation process.

(Mold Contact Step)

As illustrated in FIGS. 12[2], [3], and [4], an imprint mold 104 having an original mold pattern for transferring the pattern shape is brought into contact with the curable composition 102 formed in the previous step (stacking step illustrated in FIG. 12). The curable composition 102 is accordingly filled in the concave portions in the micropattern formed on the surface of the mold 104, and thus a liquid film filled in the micropattern on the mold is formed. The arrows 103 also indicate the direction in which the droplets (curable composition) are diffused (gradually filled in the concave portions).

As the mold 104, a mold made of an optically-transparent material is preferably be used in consideration of a subsequent step (light irradiation step). Specific examples of the material that constitutes the mold 104 and is preferably used include glass, quartz, polymethylmethacrylate (PMMA), an optically-transparent resin, such as a polycarbonate resin, a transparent metal-deposited film, a flexible membrane such as polydimethylsiloxane, a photo-cured film, and a metal film. However, in a case of using an optically-transparent resin as a material constituting the mold 104, a resin that is not dissolved in a component contained in the curable composition 102 may be desirably selected. Quartz is particularly preferably used as a material constituting the mold 104, because quartz has a small thermal expansion coefficient and a small pattern distortion.

The micropattern formed on the surface of the mold 104 preferably has a height of 4 nm or more and 200 nm or less. As the height of the micropattern decreases, a force for tearing off the mold from the photo-cured film of the curable composition in the mold release step, that is, a mold release force decreases. Further, the number of mold release defects remaining on the mask is small when the curable composition pattern is torn off in the mold release process. When the mold is torn off an impact occurs, and thus adjacent curable composition patterns may contact each other due to elastic deformation of the curable composition patterns, and the curable composition patterns may adhere to each other or may be damaged. However, if a pattern height is about twice or less a width of a pattern width (aspect ratio of 2 or less), it is highly likely that the deficiencies described above is avoided. On the other hand, if the height of the pattern is excessively low, an accuracy of processing the processed substrate becomes low.

As described above, a case where a mold with no micropattern formed on the imprint surface is used to obtain a flat surface of a curable composition is also included in the present exemplary embodiment.

To improve releasability between the photo-cured curable composition 102 and the surface of the mold 104, a surface treatment may be performed on the mold 104 before the mold contact step for bringing the curable composition 102 and the mold 104 into contact with each other. Examples of the surface treatment method include a method of forming a mold release agent layer by coating mold release agent on the surface of the mold 104. Examples of the mold release agent coated on the surface of the mold 104 include silicone-based mold release agent, fluorine-based mold release agent, hydrocarbon-based mold release agent, polyethylene-based mold release agent, polypropylene-based mold release agent, paraffin-based mold release agent, montan-based mold release agent, and carnauba-based mold release agent. For example, a commercially-available coating mold release agent, such as OPTOOL® DSX manufactured by DAIKIN INDUSTRIES, LTD, can also be preferably used. As the mold release agent, one type of mold release agent may be used singly, or two or more types of mold release agent may be used in combination. Among these examples, fluorine-based mold release agent and hydrocarbon-based mold release agent are particularly preferably used.

In this step (mold contact step), a pressure to be applied to the curable composition 102 is not particularly limited when the mold 104 and the curable composition 102 are brought into contact with each other, as illustrated in FIG. 12. The pressure may be 0 mPa or more and 100 mPa or less. The pressure is preferably 0 mPa or more and 50 mPa or less, more preferably 0 mPa or more and 30 mPa or less, and still more preferably 0 mPa or more and 20 mPa or less.

In the mold contact step, a time for bringing the mold 104 and the curable composition 102 into contact with each other is not particularly limited. For example, the time may be 0.1 seconds or more and 600 seconds or less. The time is preferably 0.1 seconds or more and three seconds or less, and more preferably 0.1 seconds or more and one second or less. If the time is less than 0.1 seconds, spreading and filling become insufficient, and thus a defect called an unfilled defect tends to occur frequently.

The mold contact step can be carried out under any conditions, such as an atmospheric atmosphere, a decompressed atmosphere, and an inert gas atmosphere. However, to prevent adverse effects of oxygen or water on a cure reaction, the mold contact step is preferably carried out under the decompressed atmosphere or the inert gas atmosphere in which inert gas is used as atmosphere controlling gas. Specific examples of inert gas that can be used to carry out this step under the inert gas atmosphere include nitrogen, carbon dioxide, helium, argon, various types of chlorofluorocarbon gas, and a mixture thereof. In a case of carrying out this step under a specific gas atmosphere including the atmospheric atmosphere, the pressure is preferably 0.0001 atmospheric pressure or more and 10 atmospheric pressure or less.

The mold contact step may be carried out using condensable gas as atmosphere controlling gas under an atmosphere including the condensable gas. This atmosphere is hereinafter referred to as a "condensable gas atmosphere". The condensable gas described herein refers to gas that is condensed and liquefied under a capillary pressure generated during filling when the gas in the atmosphere and the curable composition 102 are filled in the concave portions of the micropattern formed on the mold 104 and in a gap between the mold and the substrate. The condensable gas is present as gas in the atmosphere before the curable composition 102 and the mold 104 are brought into contact with each other in the mold contact step.

When the mold contact step is carried out under the condensable gas atmosphere, the gas filled in the concave portions of the micropattern is liquefied by the capillary pressure generated by the curable composition 102, with the result that air bubbles disappear. Accordingly, excellent filling properties are obtained. The condensable gas may be dissolved in the curable composition 102.

The boiling point of the condensable gas is not limited as long as the boiling point is less than or equal to the atmosphere temperature in the mold contact step. The boiling point is preferably −10° C. to 23° C., and more preferably 10° C. to 23° C. If the boiling point falls within this range, more excellent filling properties are obtained.

The vapor pressure of the condensable gas at the atmosphere temperature in the mold contact step is not limited as long as the vapor pressure is less than or equal to the mold pressure during imprinting in the mold contact step. The vapor pressure is preferably 0.1 to 0.4 mPa. If the vapor pressure falls within this range, more excellent filling properties are obtained. If the vapor pressure at the atmosphere temperature is more than 0.4 mPa, the advantageous effect that air bubbles disappear cannot be sufficiently obtained. On the other hand, if the vapor pressure at the atmosphere temperature is less than 0.1 mPa, decompression is required and thus the structure of the apparatus tends to be complicated. The atmosphere temperature in the mold contact step is not particularly limited. The atmosphere temperature is preferably 20° C. to 25° C.

Specific examples of the condensable gas include chlorofluorocarbon (CFC), such as trichlorofluoromethane, fluorocarbon (FC), hydrochlorofluorocarbon (HCFC), hydrofluorocarbon (HFC), such as 1,1,1,3,3-pentafluoropropane ($CHF_2CH_2CF_3$, HFC-245fa, PFP), and hydrofluoroether (HFE), such as pentafluoroethyl methyl ether ($CF_3CF_2OCH_3$, HFE-245mc).

Among these examples, 1,1,1,3,3-pentafluoropropane having a vapor pressure of 0.14 mPa at 23° C. and a boiling point of 15° C., trichlorofluoromethane having a vapor pressure of 0.1056 mPa at 23° C. and a boiling point of 24° C., and pentafluoroethyl methyl ether are preferably used from the viewpoint that excellent filling properties are obtained at the atmosphere temperature of 20° C. to 25° C.

in the mold contact step. Further, in terms of excellent safety, 1,1,1,3,3-pentafluoropropane is particularly preferably used.

As the condensable gas, one type of condensable gas may be used singly, or two or more types of condensable gas may be used in combination. These types of condensable gas may be mixed with non-condensable gas such as air, nitrogen, carbon dioxide, helium, or argon. As the non-condensable gas to be mixed with the condensable gas, helium is preferably used in terms of excellent filling properties. Helium can penetrate through the mold 104. Accordingly, when the gas (condensable gas and helium) in the atmosphere and the curable composition 102 are filled in the concave portions of the micropattern formed on the mold 104 in the mold contact step, the condensable gas is liquefied and the helium penetrates through the mold 104.

(Light Irradiation Step)

As illustrated in FIG. 12, the curable composition 102 is irradiated with light 105 through the mold 104. Specifically, the curable composition 102 filled in the micropattern on the mold 104 is irradiated with the light 105 through the mold 104. As a result, the curable composition 102 filled in the micropattern on the mold 104 is cured by the irradiated light 105, so that a cured film 106 having a pattern shape is formed.

The light 105 irradiated on the curable composition 102 filled in the micropattern on the mold 104 is then selected depending on the sensitivity wavelength of the curable composition 102. Specifically, the light is preferably selected as appropriate and used from the following lights: ultraviolet light having a wavelength of 150 nm or more and 400 nm or less, an X-ray, and an electron beam.

Among these lights, ultraviolet light is particularly preferably used as the irradiated light 105. This is because many of commercially-available curing assistants (photopolymerization initiators) are compounds having sensitivity to ultraviolet light. Examples of a light source that emits ultraviolet light include a high-pressure mercury-vapor lamp, an extra-high-pressure mercury-vapor lamp, a low-pressure mercury lamp, a deep-ultraviolet (UV) lamp, a carbon arc lamp, a chemical lamp, a metal-halide lamp, a Xenon lamp, a krypton fluoride (KrF) excimer laser, an argon fluoride (ArF) excimer laser, and an $F_2$ excimer laser. Among these light sources, an extra-high-pressure mercury-vapor lamp is particularly preferably used. One or more of these light sources may be used. In the light irradiation step, the entire surface of the curable composition 102 filled in the micropattern on the mold may be irradiated with light, or only a partial region of the curable composition 102 may be irradiated.

The light irradiation step may be intermittently performed on the entire region of the substrate a plurality of times, or may be continuously performed on the entire region of the substrate. Further, a partial region A may be irradiated with light in a first irradiation process, and a region B different from the region A may be irradiated with light in a second irradiation process.

(Mold Release Step)

The cured film 106 having a pattern shape is then released from the mold 104. In this step (mold release step), as illustrated in FIG. 12, the cured film 106 having a pattern shape is released from the mold 104, and the cured film 106 having a shape corresponding to an inverted pattern of the micropattern formed on the mold 104 in the step illustrated in FIG. 12 (light irradiation step) is obtained in an isolated state. The cured film 106 remains in the concave portions of the concave-convex pattern on the cured film 106 having a pattern shape. This remaining film is referred to as a residual layer 107.

In a case where the mold contact step is carried out under the condensable gas atmosphere, the condensable gas is vaporized as the pressure at the interface where the cured film 106 and the mold 104 contact decreases, when the cured film 106 is released from the mold 104 in the mold release step. Thus, an advantageous effect of reducing the mold release force, which is a force for releasing the cured film 106 from the mold 104, tends to be obtained.

A method for releasing the cured film 106 having a pattern shape from the mold 104 is not particularly limited as long as a part of the cured film 106 having a pattern shape is not physically damaged in the mold release step. Various conditions and the like of the method also are not particularly limited. For example, the substrate 101 (processed substrate) may be fixed and the mold 104 may be moved in a direction away from the substrate 101 to be separated. Alternatively, the mold 104 may be fixed and the substrate 101 may be moved in a direction away from the mold 104 to be separated. More alternatively, the mold 104 and the substrate 101 may be pulled in opposite directions to be separated from each other.

By continuously carrying out the above-described steps as illustrated in FIGS. 12[1] to [4] on a plurality of shot regions, a cured film having a desired concave-convex pattern shape (pattern shape corresponding to the concave-convex shape of the mold 104) at a desired position on the substrate can be obtained.

<Calculation of Leaching Height>

Figure 13:
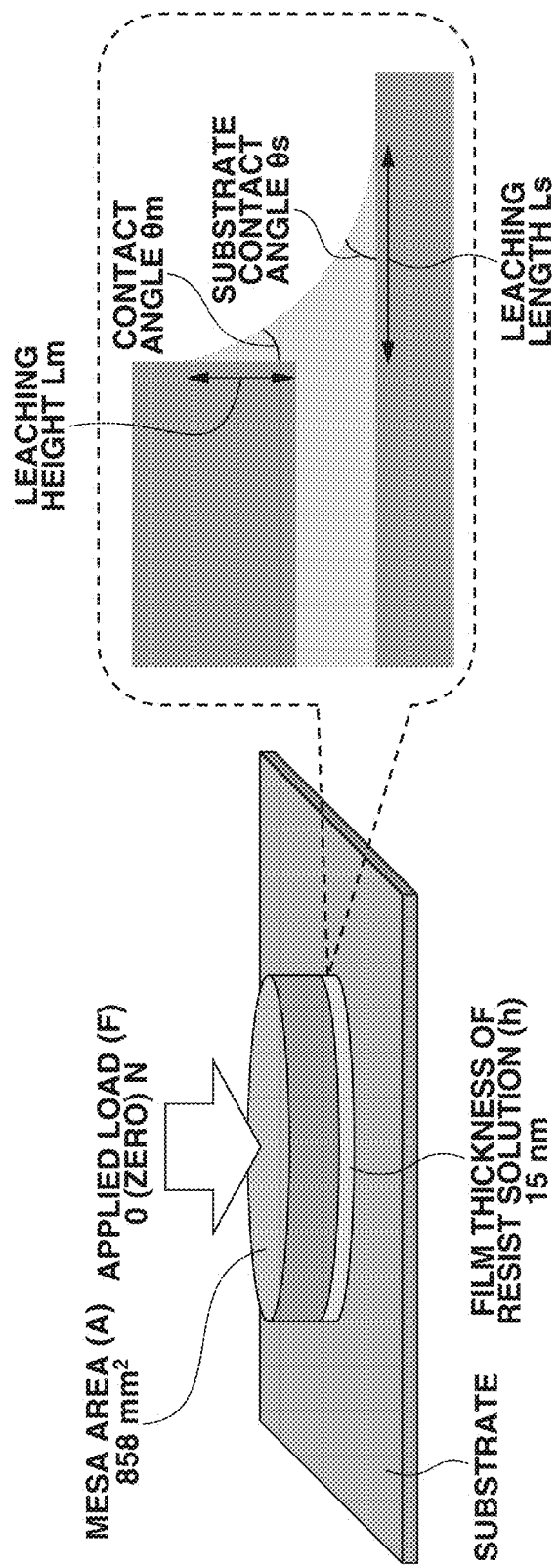
FIG. 13 illustrates a leaching height calculation model.

In a model as illustrated in FIG. 13, a relationship between a contact angle ($\theta_m$) and a leaching height of a curable composition on a liquid repellent layer surface was theoretically calculated. For simplicity of calculation, the mold was approximated as a flat cylindrical rigid body, the substrate was also approximated as a flat rigid body, and the curable composition was approximated as a Newtonian liquid. The mold surface was a flat surface with no concave-convex pattern formed thereon. A lubrication approximation was applied to the curable composition, and a leaching height ($L_m$) after a lapse of one second at a contact angle ($\theta_m$) of 0° to 90° on the liquid repellent layer surface was calculated. We assumed that an applied load (F) on the mold was zero N, a mesa area (A) was 858 mm$^2$, a liquid film thickness (h) of an initial curable composition was 15 nm, and physical property values of the curable composition were set such that a viscosity ($\mu$) was 5 mPa·s, a surface tension ($\gamma$) was 30 mN/m, and a substrate contact angle ($\theta_s$) was 0°.

Figure 14:
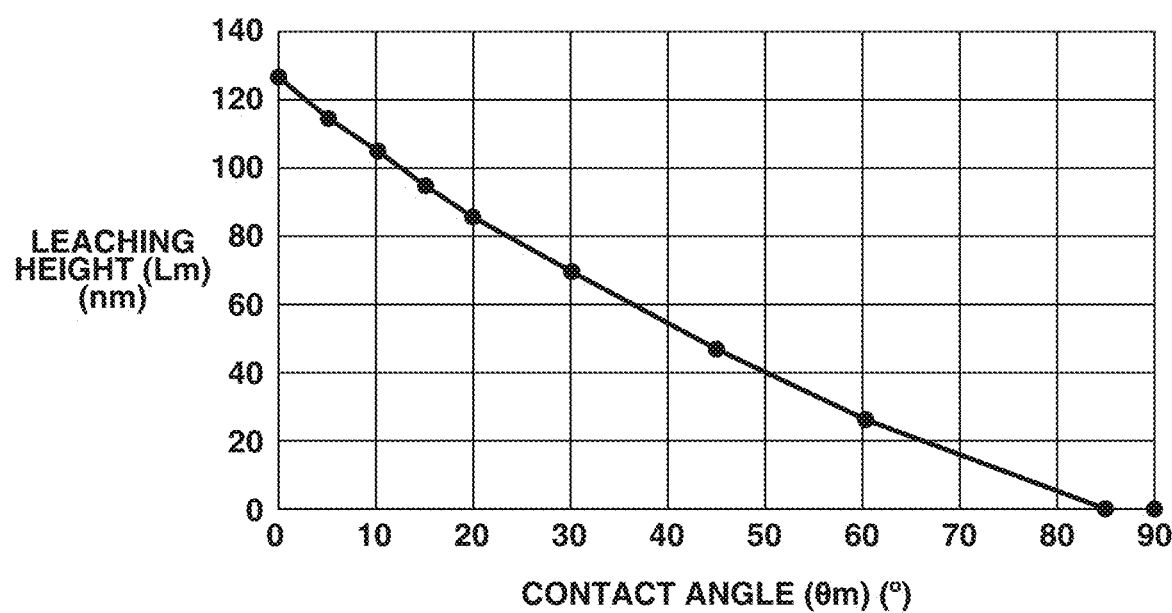
FIG. 14 is a graph illustrating results of calculating the leaching height.

FIG. 14 illustrates a graph of the calculation results. Even when the applied load (F) is zero N, a behavior in which the mold is pulled toward the substrate and caused to descend by a meniscus force generated by a meniscus formed between the mold and the substrate as a driving force, and leaching occurs due to a squeezing effect resulting from the descending mold was quantitatively calculated. The leaching height ($L_m$) was 5° or more, which was significantly lower than that in a case where the contact angle ($\theta_m$) on the liquid repellent layer surface was 0°. At the contact angle ($\theta_m$) of 30°, the leaching height ($L_m$) was about 55%. At the contact angle ($\theta_m$) of 60°, the leaching height ($L_m$) was about 20%. At the contact angle ($\theta_m$) of 90°, the leaching height ($L_m$) was zero nm. The above-described calculation has proved that leaching can be improved by the liquid repellent layer according to the present exemplary embodiment.

A method of manufacturing an article according to an exemplary embodiment of the present disclosure is suitable for, for example, manufacturing articles, including a microdevice, such as a semiconductor device, and a device having a fine structure. The method of manufacturing an article according to the present exemplary embodiment includes a step of forming a pattern by an imprint apparatus capable of using the above-described mold as an imprint material coated on a substrate (step of performing an imprint process on a substrate), and a step of processing the substrate on which the pattern is formed in the previous step. The manufacturing method further includes other well-known steps (e.g., oxidization, film formation, deposition, doping, planarization, etching, resist removal, dicing, bonding, and packaging). The method of manufacturing an article according to the present exemplary embodiment is advantageous in at least one of the performance, quality, productivity, and production cost of the article as compared with the related art method.

A pattern of a cured product formed by an imprint apparatus is permanently used for at least a part of various articles, or is temporarily used to manufacture various articles. Examples of the articles include an electric circuit element, an optical element, a microelectromechanical system (MEMS), a recording element, a sensor, and a mold. Examples of the electric circuit element include volatile or nonvolatile semiconductor memories such as a dynamic random-access memory (DRAM), a static RAM (SRAM), a flash memory, and a magnetic RAM (MRAM), and semiconductor devices such as a large-scale integration (LSI), a charge-coupled device (CCD), an image sensor, and a field programmable gate array (FPGA). Examples of the mold include an imprint mold.

The pattern of the cured product is directly used as a component of at least apart of the articles described above, or is temporarily used as a resist mask. The resist mask is removed after etching, ion implantation, or the like is carried out in a substrate processing step.

Figure 15A:
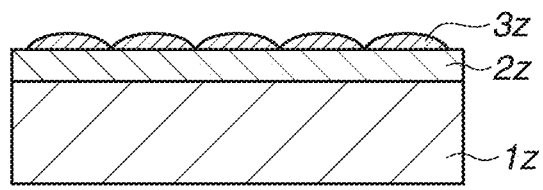
FIGS. 15A to 15F are diagrams illustrating a method of manufacturing an article according to the exemplary embodiment of the present disclosure.

Next, a specific method of manufacturing an article according to the exemplary embodiment will be described. As illustrated in FIG. 15A, a substrate 1z, such as a silicon wafer, on which a processed material 2z, such as an insulating material, is formed is prepared. An imprint material 3z is then applied to the surface of the processed material 2z by the inkjet method or the like. FIG. 15A illustrates a state where the imprint material 3z is applied onto the substrate 1z in a form of a plurality of droplets.

Figure 15B:
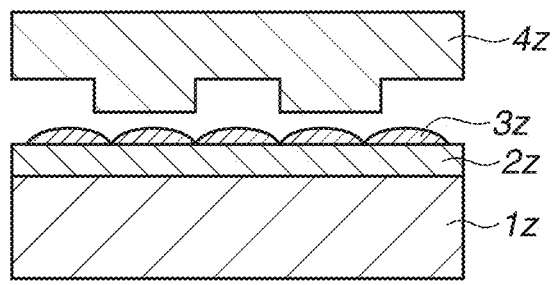
Figure 15C:
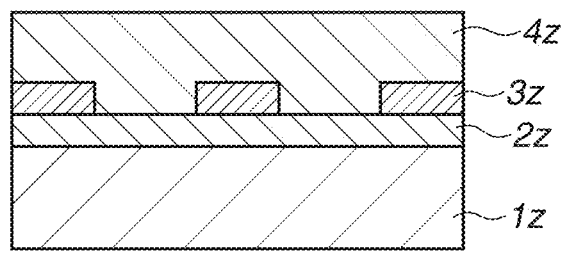

As illustrated in FIG. 15B, an imprint mold 4z is disposed such that a side of the imprint mold 4z on which the concave-convex pattern is formed is opposed to the imprint material 3z on the substrate 1z. As illustrated in FIG. 15C, the substrate 1z to which the imprint material 3z is applied and the mold 4z are brought into contact with each other and a pressure is applied to the substrate 1z and the mold 4z. The imprint material 3z is filled in a gap between the mold 4z and the processed material 2z. In this state, when the imprint material 3z is irradiated with light as curing energy through the mold 4z, the imprint material 3z is cured.

Figure 15D:
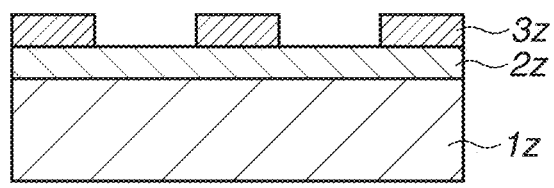

As illustrated in FIG. 15D, after the imprint material 3z is cured, the mold 4z is separated from the substrate 1z and the residual layer is removed. Thus, a pattern of a cured product of the imprint material 3z is formed on the substrate 1z. The pattern of the cured product has such a shape that concave portions of the mold correspond to convex portions of the cured product and concave portions of the mold correspond to convex portions of the cured product. In other words, the concave-convex pattern of the mold 4z is transferred to the imprint material 3z.

Figure 15E:
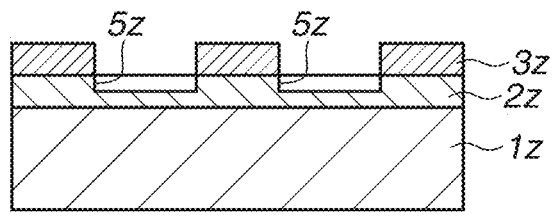
Figure 15F:
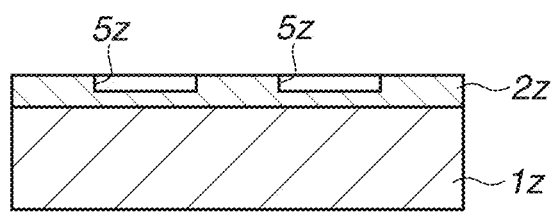

As illustrated in FIG. 15E, when etching is performed using the pattern of the cured product as an etching-resistant mask, portions where the cured product is not present or slightly remains on the surface of the processed material 2z are removed, and the removed portions correspond to grooves 5z. As illustrated in FIG. 15F, when the pattern of the cured product is removed, an article in which the grooves 5z are formed on the surface of the processed material 2z can be obtained. In this case, the pattern of the cured product is removed. Instead of removing the pattern of the cured product after processing, the pattern of the cured product may be used as, for example, an interlayer insulation film included in a semiconductor device or the like, i.e., a component of the article.

According to an aspect of the present disclosure, it is possible to provide an imprint mold that exhibits liquid repellency with respect to a curable composition and includes a liquid repellent surface, which is highly durable to the cleaning step, on a side wall of a mesa portion, a manufacturing method of the imprint mold, and an imprint method.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-083329, filed Apr. 24, 2019, which is hereby incorporated by reference herein in its entirety.

What is claimed is:

1. An imprint mold comprising a mesa portion projecting from a base material,
   wherein the mesa portion includes a contact surface configured for contact with a curable composition made of an organic material, and a surface of a side wall at which the contact surface projects from the base material,
   wherein a liquid repellent surface is formed on at least the surface of the side wall, the liquid repellent surface having a contact angle with respect to the curable composition being higher than a contact angle of the contact surface, and
   wherein the liquid repellent surface includes at least one type of compound selected from the group consisting of an oxide of an inorganic element, and a nitride of an inorganic element.

2. The imprint mold according to claim 1, wherein the liquid repellent surface is a surface of a liquid repellent layer containing the inorganic compound.

3. The imprint mold according to claim 1, wherein the liquid repellent surface is a) a layer of an oxide selected from a group or b) a layer of a mixture of a plurality of oxides selected from the group, the group consisting of an oxide of hafnium (Hf), an oxide of yttrium (Y), an oxide of lanthanum (La), an oxide of cerium (Ce), an oxide of praseodymium (Pr), an oxide of neodymium (Nd), an oxide of promethium (Pm), an oxide of samarium (Sm), an oxide of europium (Eu), an oxide of gadolinium (Gd), an oxide of terbium (Tb), an oxide of dysprosium (Dy), an oxide of holmium (Ho), an oxide of erbium (Er), an oxide of thulium (Tm), an oxide of ytterbium (Yb), and an oxide of lutetium (Lu).

4. The imprint mold according to claim 1, wherein the liquid repellent surface is a layer of any one of a nitride of silicon (Si), a nitride of germanium (Ge), a nitride of boron (B), and a nitride of aluminum (Al), or a mixture of two or more of these nitrides.

5. The imprint mold according to claim 1, wherein the liquid repellent surface is a quartz surface doped with fluorine atoms.

6. The imprint mold according to claim 1, wherein the liquid repellent surface is a layer of a mixture of a plurality of oxides selected from the group, the group consisting of an oxide of hafnium (Hf), an oxide of zirconium (Zr), an oxide of yttrium (Y), an oxide of tantalum (Ta), an oxide of niobium (Nb), an oxide of lanthanum (La), an oxide of cerium (Ce), an oxide of praseodymium (Pr), an oxide of neodymium (Nd), an oxide of promethium (Pm), an oxide of samarium (Sm), an oxide of europium (Eu), an oxide of gadolinium (Gd), an oxide of terbium (Tb), an oxide of dysprosium (Dy), an oxide of holmium (Ho), an oxide of erbium (Er), an oxide of thulium (Tm), an oxide of ytterbium (Yb), and an oxide of lutetium (Lu).

7. The imprint mold according to claim 1, wherein the contact angle of the liquid repellent surface with respect to the curable composition is 5° or more.

8. The imprint mold according to claim 1, wherein the contact angle of the liquid repellent surface with respect to water is 93° or more.

9. An imprint mold comprising a mesa portion projecting from a base material,
wherein the mesa portion includes a contact surface configured for contact with a curable composition made of an organic material, and a surface of a side wall at which the contact surface projects from the base material, and
wherein a surface of an inorganic compound is formed on at least the surface of the side wall, the surface of the inorganic compound having a cleaning resistance to dry cleaning with an oxygen plasma and/or wet cleaning with an oxidative liquid, a contact angle of the surface of the inorganic compound with respect to the curable composition being higher than a contact angle of the contact surface.

10. The imprint mold according to claim 9, wherein the surface of the inorganic compound is a layer of any one of a fluoride of silicon (Si), a fluoride of chromium (Cr), a fluoride of calcium (Ca), a fluoride of magnesium (Mg), a fluoride of titanium (Ti), a fluoride of aluminum (Al), a fluoride of yttrium (Y), and a fluoride of nickel (Ni), or a mixture of two or more of these fluorides.

11. The imprint mold according to claim 9, wherein the surface includes at least one type of inorganic compound selected from the group consisting of an oxide of an inorganic element, a fluoride of an inorganic element, and a nitride of an inorganic element.

* * * * *